(12) United States Patent
Abdelfattah

(10) Patent No.: US 12,323,121 B2
(45) Date of Patent: Jun. 3, 2025

(54) TUNABLE FILTERING USING CONDUCTIVELY COUPLED RESONANCES

(71) Applicant: SKYWORKS SOLUTIONS, INC., Irvine, CA (US)

(72) Inventor: Mahmoud Musbah Ahmad Abdelfattah, Simi Valley, CA (US)

(73) Assignee: SKYWORKS SOLUTIONS, INC., Irvine, CA (US)

(*) Notice: Subject to any disclaimer, the term of this patent is extended or adjusted under 35 U.S.C. 154(b) by 262 days.

(21) Appl. No.: 17/948,566

(22) Filed: Sep. 20, 2022

(65) Prior Publication Data

US 2023/0088761 A1    Mar. 23, 2023

Related U.S. Application Data

(60) Provisional application No. 63/247,578, filed on Sep. 23, 2021.

(51) Int. Cl.
*H03H 7/01* (2006.01)

(52) U.S. Cl.
CPC .............................. *H03H 7/0115* (2013.01)

(58) Field of Classification Search
CPC .......... H03H 7/0115; H03H 7/00; H03H 7/01; H03H 7/1758; H03H 7/1766; H03H 7/09; H03H 7/0153; H03H 7/1791; H03H 2007/013

USPC ....... 333/174, 175, 176, 179, 180, 181, 182, 333/183, 184, 185, 205, 209, 235

See application file for complete search history.

(56) References Cited

U.S. PATENT DOCUMENTS

| | | | |
|---|---|---|---|
| 10,305,184 B2* | 5/2019 | Ishizuka | H01Q 1/243 |
| 12,003,263 B2* | 6/2024 | Jia | H04B 1/1036 |
| 2021/0408992 A1 | 12/2021 | Chen et al. | |
| 2021/0409047 A1 | 12/2021 | Chen et al. | |

* cited by examiner

*Primary Examiner* — Hai L Nguyen
(74) *Attorney, Agent, or Firm* — Lando & Anastasi, LLP

(57) ABSTRACT

A filter circuit including a plurality of capacitances and a plurality of inductances including one variable reactance that is either an inductance or a capacitance. The filter circuit has a plurality of resonant modes that each correspond to resonance at a resonant frequency between the variable reactance and one or more of the plurality of inductances and one or more of the plurality of capacitances. The variable reactance is conductively coupled with one or more other inductances and capacitances of the pluralities of inductances and capacitances such that a change in the variable reactance causes a change in a resonant frequency of more than one of the plurality of resonant modes. Front-end modules and wireless communication devices incorporating such a filter circuit and a method using such a filter circuit are also described.

26 Claims, 13 Drawing Sheets

TUNABLE FILTERING USING CONDUCTIVELY COUPLED RESONANCES

CROSS-REFERENCE TO RELATED APPLICATIONS

This application claims priority under 35 U.S.C. § 119(e) to U.S. Provisional Patent Application Ser. No. 63/247,578, titled "TUNABLE FILTERING USING CONDUCTIVELY COUPLED RESONANCES," filed Sep. 23, 2021, the entire contents of which is incorporated herein by reference for all purposes.

BACKGROUND

Field

Embodiments of the present disclosure relate to filters arranged to filter signals, such as radio frequency signals.

Description of the Related Technology

Radio frequency (RF) communication systems can be used for transmitting and/or receiving signals in a wide range of frequencies. For example, an RF communication system can be used to wirelessly communicate RF signals in a frequency range from about 30 kHz to about 300 GHz, such as in the range of about 410 megahertz (MHz) to about 7.125 gigahertz (GHz) for Fifth Generation (5G) cellular communications in Frequency Range 1 (FR1).

RF communication systems can include without limitation mobile phones, tablets, base stations, network access points, customer-premises equipment (CPE), laptops, and wearable electronics.

In certain applications, RF communications systems can process a plurality of RF signals concurrently. In such RF communications systems, filters with strong harmonic rejection can be desirable. Filters with strong harmonic rejection are desirable in a variety of applications.

SUMMARY

According to an aspect of the present disclosure a filter circuit is provided. The filter circuit comprises a plurality of capacitances and a plurality of inductances including one variable reactance that is either an inductance or a capacitance; and a plurality of resonant modes that each correspond to resonance at a resonant frequency between the variable reactance and one or more of the plurality of inductances and one or more of the plurality of capacitances, the variable reactance being conductively coupled with one or more other inductances and capacitances of the pluralities of inductances and capacitances such that a change in the variable reactance causes a change in a resonant frequency of more than one resonant mode of the plurality of resonant modes.

In one example the variable reactance is conductively coupled with each of the plurality of resonant modes by at least one inductance or capacitance that prevents any other inductances and capacitances forming resonant modes independent of the variable reactance. Alternatively or additionally no inductance of the plurality of inductances is mutually coupled with any other inductance of the plurality of inductances, or at least any mutual coupling of inductances has negligible effect or no measurable effect—mutual coupling between inductances of the plurality of inductances may be substantially zero or alternatively the maximum magnitude of any coupling coefficient between any pair of inductances of the plurality of inductances coefficients may be less than a threshold, such as less than $10^{-2}$, more preferably less than $10^{-3}$, even more preferably less than $10^{-4}$, even more preferably less than $10^{-5}$, even more preferably less than $10^{-6}$, even more preferably less than $10^{-7}$, even more preferably less than $10^{-7}$, even more preferably less than $10^{-8}$, even more preferably less than $10^{-9}$, even more preferably less than $10^{-10}$, even more preferably less than $10^{-11}$, and even more preferably less than $10^{-12}$, wherein such coupling coefficients may be measured at an appropriate frequency of operation for the filter circuit. Alternatively or additionally the variable reactance may be a variable capacitance that includes one or more of: a mechanically controllable variable capacitor, an electrically controllable varactor or variable capacitor, and a plurality of selectively engageable capacitors. Or alternatively the variable reactance may be a variable inductance that includes one or more of: a mechanically controllable variable inductor, an electrically controllable variable inductor, and a plurality of selectively engageable inductors. Each of the plurality of capacitances may include at least one capacitor and each of the plurality of inductances may include at least one inductor. Alternatively or additionally the filter circuit is a band-stop filter circuit that has a frequency response that includes a plurality of stopbands of which at least two stopbands are at different resonant frequencies of the plurality of resonant modes, such that a change in the variable reactance causes changes in frequencies of the at least two stopbands. The variable reactance may be variable between a first reactance value to provide harmonic notch filtering for a first base frequency and a second reactance value to provide harmonic notch filtering for a second base frequency, and the frequencies of the at least two stopbands when the variable reactance has the first reactance value are integer multiples of the first base frequency and the frequencies of the at least two stopbands when the variable has the second reactance value are the same integer multiples of the second base frequency. A first stopband of the at least two stopbands may have a frequency that is twice the first base frequency when the variable reactance has the first reactance value and may have a frequency that is twice the second base frequency when the variable reactance has the second reactance value. A second stopband of the at least two stopbands may have a frequency that is three times the first base frequency when the variable reactance has the first reactance value and may have a frequency that is three times the second base frequency when the variable reactance has the second reactance value. A ratio between the frequencies of the at least two stopbands may increase, decrease or remain unchanged when the variable reactance is changed. The filter circuit of may be configured to filter radio frequency signals.

Alternatively or in addition to any of the previously described examples and embodiments, optionally including or excluding any of the previously described features, the filter circuit may further comprise a first terminal, a second terminal and a third terminal, the circuit configured to filter signals transmitted between the first terminal and the second terminal. The third terminal may be a ground terminal.

In one example, in which the filter circuit comprises the first terminal, second terminal and third terminal, the plurality of inductances includes first and second inductances, the plurality of capacitances includes first, second and third capacitances, the first capacitance being the variable reactance, the first inductance and first capacitance coupled in parallel between the first terminal and the second terminal; the second inductance coupled between the second terminal and a first node, the second capacitance coupled between the first node and the third terminal, and the third capacitance coupled between the first terminal and the first node. Additionally the plurality of inductances may include a third inductance in series with the second capacitance between the first node and the third terminal. Alternatively or additionally the filter circuit may be a second-order bandstop filter having two stopbands and changing of the first capacitance may cause changing of the frequencies of each of the two stopbands.

In another example, in which the filter circuit comprises the first terminal, second terminal and third terminal, the plurality of inductances includes first, second and third inductances and the plurality of capacitances includes first, second and third capacitances, the first capacitance being the variable reactance, the first inductance coupled between the first terminal and a first node, the second inductance coupled between the first node and the second terminal, the first capacitance coupled between the first terminal and a second node, the second capacitance coupled between the second node and the second terminal, the third inductor coupled between the first node and the second node, the third capacitance coupled between the first node and the third terminal. The filter circuit may be a third-order bandstop filter having two stopbands and changing of the first capacitance may cause changing of the frequencies of each of the two stopbands. Alternatively the plurality of inductances may include a fourth inductance and the plurality of capacitances may include a fourth capacitance, the fourth inductance coupled in series with the third capacitance between the second node and the third capacitance, the fourth capacitance coupled between the first terminal and a third node that is between the third capacitance and fourth inductance. Such a filter circuit may be a third-order bandstop filter having three stopbands and changing of the first capacitance may cause changing of the frequencies of each of the three stopbands. The plurality of inductances may include a fifth inductance in series with the third capacitance between the third node and the third terminal.

According to another embodiment there is provided a method of filtering radio frequency signals, the method comprising: filtering a first signal with any of the previously described filter circuits, the filter circuit having a first frequency response that includes a plurality of stopbands; after filtering the first signal, changing the frequency response of the filter circuit to a second frequency response in which at least two stopbands of the plurality of stopbands are changed relative to the first frequency by changing a reactance value of a variable reactance of the filter circuit; and after changing the frequency response of the filter circuit to the second frequency response, filtering a second signal with the filter circuit. The first and second signals may be radio frequency signals.

According to another embodiment there is provided a front-end module comprising any of the previously described filter circuits.

In one example the front-end module further comprises a power amplifier, the filter circuit configured to filter an amplified signal output of the power amplifier.

In one example the front-end module further comprises an antenna switch, the filter circuit configured to filter a signal output of the antenna switch.

According to another embodiment there is provided a wireless communication device comprising: any of the previously described filter circuits; and an antenna configured to transmit a signal filtered by the filter circuit.

In one example, the wireless communication device comprises any of the previously described front-end modules, the previously described filter circuit being included in the front-end module.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Figure 1:
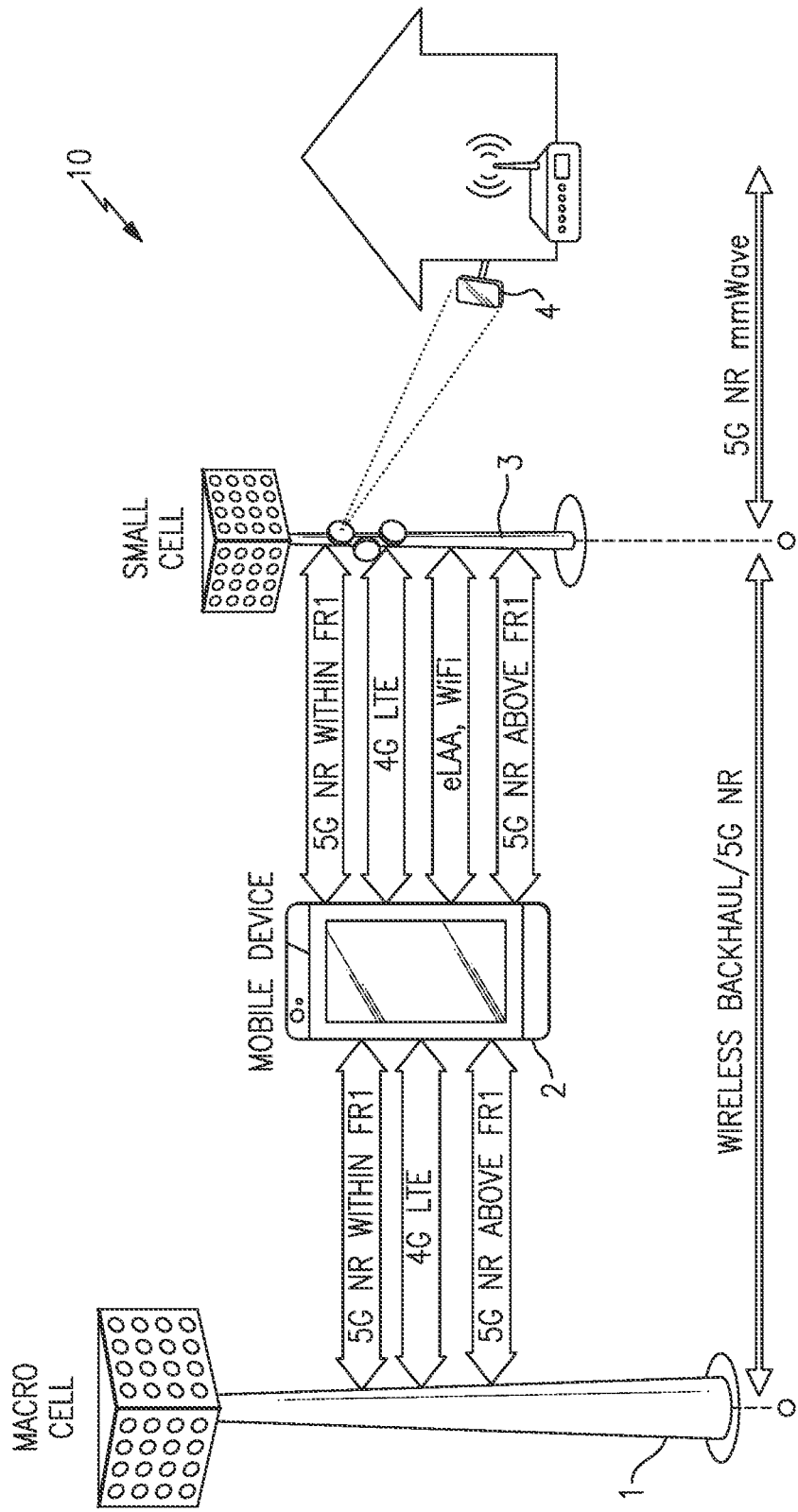
FIG. 1 is a schematic diagram of one example of a communication network.

Aspects and embodiments described herein are directed to filter circuit topologies and applications of such topologies, including their use in a wireless communications device.

The filter circuit topologies includes multiple inductances and capacitances to provide multiple resonances. One of the reactances (inductances or capacitances) is variable, which may be through the use of multiple inductors or capacitors in parallel that can be selectively engaged to provide a desired inductance or capacitance, or may be through other means such as electrically or mechanically variable inductors or capacitors.

In some existing LC filter circuits that have more than one resonant mode, each LC resonant mode is independent of the others (i.e., uncoupled). It is possible in such circuits to change each resonant frequency by changing the value of an inductance or capacitance in the LC components of each resonant mode. In such existing LC filter circuits, this requires multiple components to be variable. For some applications this may be undesirable. For example, it may require additional control circuitry to control the multiple variable components, or may require additional physical space in any circuit layout.

In the filter circuit topologies according to the techniques of the present disclosure, resonances of each of a plurality of resonant modes include resonance with a common variable reactance (variable inductance or capacitance) and so a change in the value of the common variable reactance causes changes in the resonant frequencies of multiple resonant modes. Therefore multiple resonant frequencies can be changed without requiring multiple separate variable inductances or capacitances. Therefore the filter circuit topologies of the present disclosure do not require multiple inductances or capacitances to be varied to change multiple resonant frequencies. Some implementations may therefore include only a single variable inductance or capacitance.

Filter circuits according to the techniques of this disclosure may include additional resonant modes in which a resonant frequency is not affected by a change in the variable reactance. Such resonant modes may be uncoupled from and independent of the variable reactance. Alternatively, each resonant mode of the plurality of resonant modes in the filter circuit may be coupled with the variable reactance such that a change in the variable reactance causes a change in the resonant frequency of each of the resonant modes of the plurality of resonant modes in the filter circuit.

In the filter circuit topologies according to the techniques of the present disclosure, the coupling of multiple resonant modes with a common variable reactance is a conductive coupling rather than an inductive coupling. Achieving a desired degree of inductive coupling may require considering the placement of inductive components in a circuit and may require tight manufacturing tolerances on such placement and may not always be realizable with some inductor technologies such as surface mount technology (SMT). Since the filter circuit topologies according to the techniques of the present disclosure do not depend on inductive coupling to achieve coupling of resonant modes, implementations of such circuits may have more freedom in placement or type of components.

Some implementations of the filter circuit topologies according to the techniques of the present disclosure include a bandstop or notch filter, such as a harmonic bandstop or notch filter. For example, a power amplifier may introduce harmonic distortion relative to a base frequency due to non-linearities in its amplification. A harmonic filter may be configured to provide notches or stopbands at harmonics of the base frequency. Such harmonics might be any of, for example, second harmonics, third harmonics, fourth harmonics, fifth harmonics etc. By varying only a single variable reactance, the frequencies of the notches or stopbands may be varied. Therefore the same filter circuit may provide a desired filtering of harmonic signal components, such as harmonic distortion at particular harmonics, when the power amplifier amplifies a signal that has a different base frequency. The filter circuit may be tuned to provide harmonic notch/bandstop filtering at multiple notches/stopbands for different base frequencies by changing only the value of a single variable reactance.

The general terms 'bandstop' and 'stopband' are used herein to describe the techniques of this disclosure, where a stopband is a band of frequencies about a center frequency in which signals are rejected or attenuated. References to a stopband's 'frequency' should be understood to refer to a stopband's center frequency. In filter circuit topologies according to the techniques of this disclosure, any or all stopbands may be notches, i.e., stopbands having a high Q factor, such a Q factor that is greater than 1, more preferably greater than 2, more preferably greater than 3, more preferably greater than 4, more preferably greater than 5, more preferably greater than 7, more preferably greater than 8, more preferably greater than 9, more preferably greater than 10, more preferably greater than 20, more preferably greater than 30, more preferably greater than 40, more preferably greater than 50, even more preferably greater than 100, and even more preferably greater than 200.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and is currently in the process of developing Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

Communication Network

FIG. 1 is a schematic diagram of one example of a communication network 10. The communication network 10 includes a macro cell base station 1, a mobile device 2, a small cell base station 3, and a stationary wireless device 4.

The illustrated communication network 10 of FIG. 1 supports communications using a variety of technologies, including, for example, 4G LTE, 5G NR, and wireless local area network (WLAN), such as Wi-Fi. In the communication network 10, dual connectivity can be implemented with concurrent 4G LTE and 5G NR communication with the mobile device 2. Although various examples of supported communication technologies are shown, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

As shown in FIG. 1, the mobile device 2 communicates with the macro cell base station 1 over a communication link that uses a combination of 4G LTE and 5G NR technologies. The mobile device 2 also communications with the small cell base station 3. In the illustrated example, the mobile device 2 and small cell base station 3 communicate over a communication link that uses 5G NR, 4G LTE, and Wi-Fi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed Wi-Fi frequencies).

In certain implementations, the mobile device 2 communicates with the macro cell base station 1 and the small cell base station 3 using 5G NR technology over one or more frequency bands that are within Frequency Range 1 (FR1) and/or over one or more frequency bands that are above FR1. The one or more frequency bands within FR1 can be less than 6 GHz. For example, wireless communications can utilize FR1, Frequency Range 2 (FR2), or a combination thereof. In one embodiment, the mobile device 2 supports a HPUE power class specification.

The illustrated small cell base station 3 also communicates with a stationary wireless device 4. The small cell base station 3 can be used, for example, to provide broadband service using 5G NR technology. In certain implementations, the small cell base station 3 communicates with the stationary wireless device 4 over one or more millimeter wave frequency bands in the frequency range of 30 GHz to 300 GHz and/or upper centimeter wave frequency bands in the frequency range of 24 GHz to 30 GHz.

In certain implementations, the small cell base station 3 communicates with the stationary wireless device 4 using beamforming. For example, beamforming can be used to focus signal strength to overcome path losses, such as high loss associated with communicating over millimeter wave frequencies.

The communication network 10 of FIG. 1 includes the macro cell base station 1 and the small cell base station 3. In certain implementations, the small cell base station 3 can operate with relatively lower power, shorter range, and/or with fewer concurrent users relative to the macro cell base station 1. The small cell base station 3 can also be referred to as a femtocell, a picocell, or a microcell.

Although the communication network 10 is illustrated as including two base stations, the communication network 10 can be implemented to include more or fewer base stations and/or base stations of other types. As shown in FIG. 1, base stations can communicate with one another using wireless communications to provide a wireless backhaul. Additionally or alternatively, base stations can communicate with one another using wired and/or optical links.

The communication network 10 of FIG. 1 is illustrated as including one mobile device and one stationary wireless device. The mobile device 2 and the stationary wireless device 4 illustrate two examples of user devices or user equipment (UE). Although the communication network 10 is illustrated as including two user devices, the communication network 10 can be used to communicate with more or fewer user devices and/or user devices of other types. For example, user devices can include mobile phones, tablets, laptops, IoT devices, wearable electronics, and/or a wide variety of other communications devices.

User devices of the communication network 10 can share available network resources (for instance, available frequency spectrum) in a wide variety of ways.

In one example, frequency division multiple access (FDMA) is used to divide a frequency band into multiple frequency carriers. Additionally, one or more carriers are allocated to a particular user. Examples of FDMA include, but are not limited to single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user device a unique code, space-divisional multiple access (SDMA) in which beamforming is used to provide shared access by spatial division, and non-orthogonal multiple access (NOMA) in which the power domain is used for multiple access. For example, NOMA can be used to serve multiple user devices at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user device. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to eMBB, uRLLC, and/or mMTC.

A peak data rate of a communication link (for instance, between a base station and a user device) depends on a variety of factors. For example, peak data rate can be affected by channel bandwidth, modulation order, a number of component carriers, and/or a number of antennas used for communications.

For instance, in certain implementations, a data rate of a communication link can be about equal to $M*B*\log_2(1+S/N)$, where M is the number of communication channels, B is the channel bandwidth, and S/N is the signal-to-noise ratio (SNR).

Accordingly, the data rate of a communication link can be increased by increasing the number of communication channels (for instance, transmitting and receiving using multiple antennas), using wider bandwidth (for instance, by aggregating carriers), and/or improving SNR (for instance, by increasing transmit power and/or improving receiver sensitivity).

5G NR communication systems can employ a wide variety of techniques for enhancing data rate and/or communication performance.

Carrier Aggregation

Figure 2A:
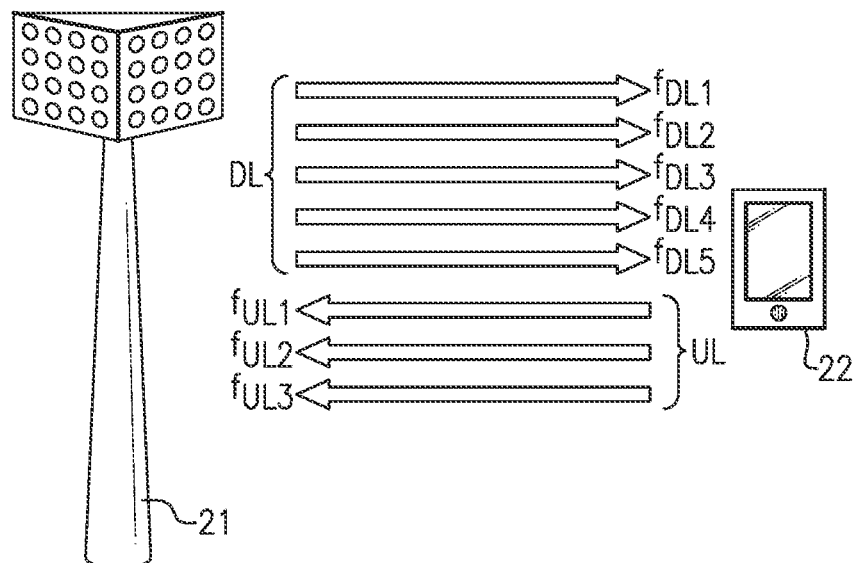
FIG. 2A is a schematic diagram of one example of a communication link using carrier aggregation.

FIG. 2A is a diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations. Carrier aggregation can present challenges for harmonic rejection. Filters disclosed herein can be implemented to provide harmonic rejection in carrier aggregation applications. Radio frequency front end architectures disclosed herein can be implemented in dual connectivity applications.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
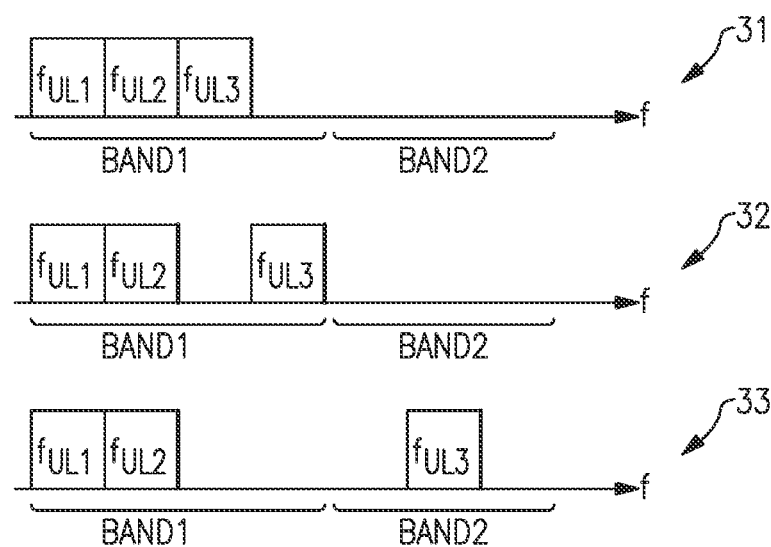
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more component carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
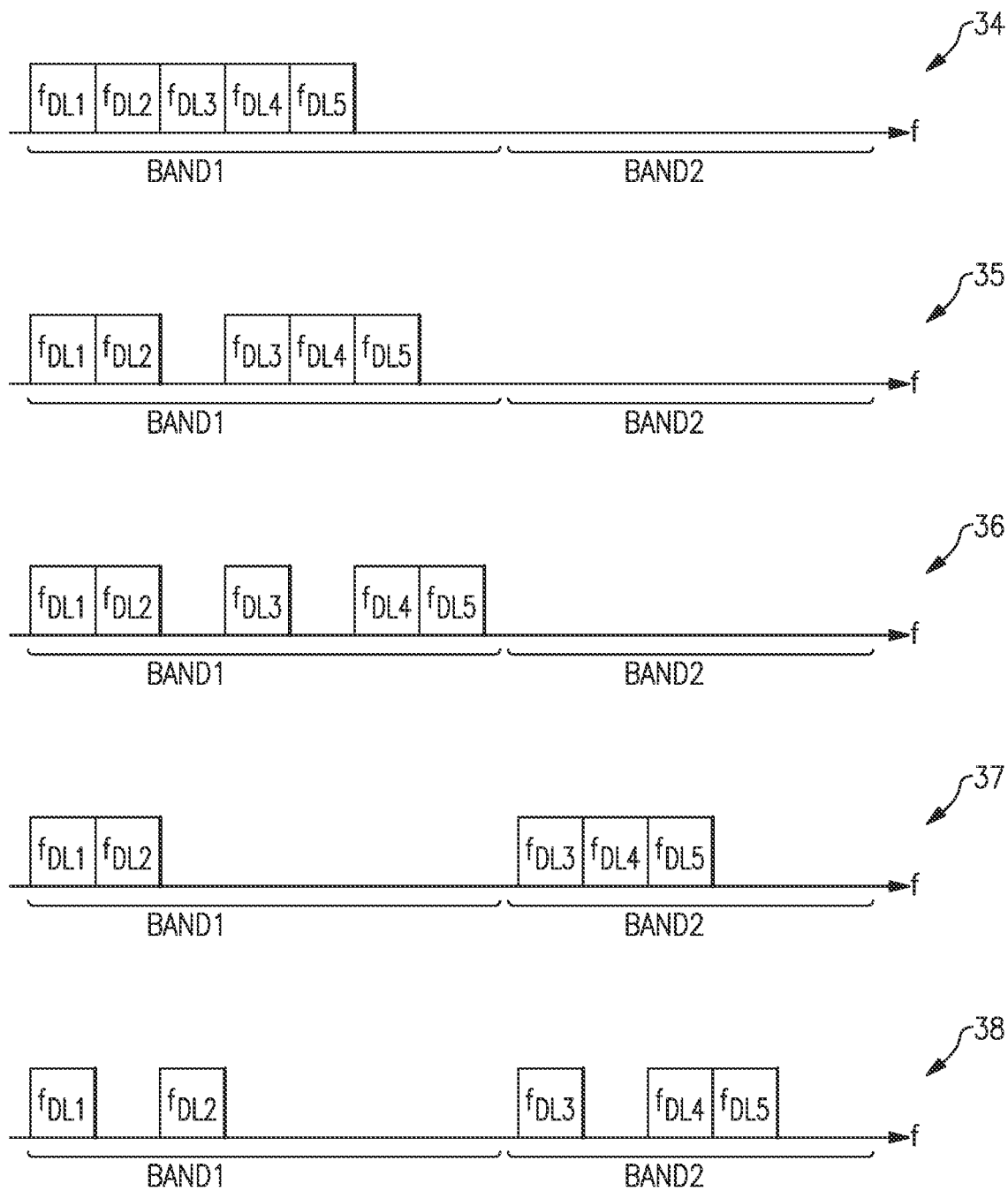
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as Wi-Fi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid Wi-Fi users and/or to coexist with Wi-Fi users. Enhanced license assisted access (eLAA) refers to an evolution of LAA that aggregates licensed and unlicensed spectrum for both downlink and uplink.

Dual Connectivity

With the introduction of the 5G NR air interface standards, 3GPP has allowed for the simultaneous operation of 5G and 4G standards in order to facilitate the transition. This mode can be referred to as Non-Stand-Alone (NSA) operation or E-UTRAN New Radio-Dual Connectivity (EN-DC) and involves both 4G and 5G carriers being simultaneously transmitted and/or received from a user equipment (UE). EN-DC can present challenges for harmonic rejection. Filters disclosed herein can be implemented to provide harmonic rejection in dual connectivity applications. Radio frequency front end architectures disclosed herein can be implemented in dual connectivity applications.

In certain EN-DC applications, dual connectivity NSA involves overlaying 5G systems onto an existing 4G core network. For dual connectivity in such applications, the control and synchronization between the base station and the UE can be performed by the 4G network while the 5G network is a complementary radio access network tethered to the 4G anchor. The 4G anchor can connect to the existing 4G network with the overlay of 5G data/control.

Figure 3:
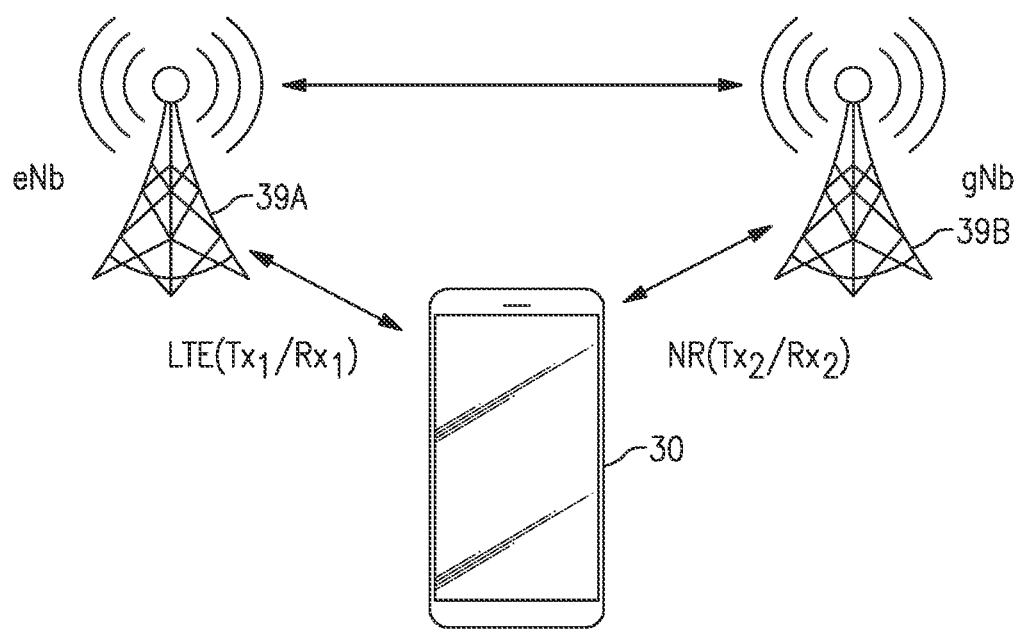
FIG. 3 is a diagram of an example dual connectivity network topology.

FIG. 3 is a diagram of an example dual connectivity network topology. This architecture can leverage LTE legacy coverage to ensure continuity of service delivery and the progressive rollout of 5G cells. A UE 30 can simultaneously transmit dual uplink LTE and NR carriers. The UE 30 can transmit an uplink LTE carrier Tx1 to the eNodeB (eNB) 39A while transmitting an uplink NR carrier Tx2 to the gNodeB (gNB) 39B to implement dual connectivity. Any suitable combination of uplink carriers Tx1, Tx2 and/or downlink carriers Rx1, Rx2 can be concurrently transmitted via wireless links in the example network topology of FIG. 3. The eNB 39A can provide a connection with a core network, such as an Evolved Packet Core (EPC). The gNB 39B can communicate with the core network via the eNB 39A. Control plane data can be wirelessly communicated between the UE 30 and eNB 39A. The eNB 39A can also communicate control plane data with the gNB 39B.

In the example dual connectivity topology of FIG. 3, any suitable combinations of standardized bands and radio access technologies (e.g., FDD, TDD, SUL, SDL) can be wirelessly transmitted and received. This can present technical challenges related to having multiple separate radios and bands functioning in the UE 30. With a TDD LTE anchor point, network operation may be synchronous, in which case the operating modes can be constrained to Tx1/Tx2 and Rx1/Rx2, or asynchronous which can involve Tx1/Tx2, Tx1/Rx2, Rx1/Tx2, Rx1/Rx2. When the LTE anchor is a frequency division duplex (FDD) carrier, the TDD/FDD inter-band operation can involve simultaneous Tx1/Rx1/Tx2 and Tx1/Rx1/Rx2.

Filtering Circuits with Only One Adjustable Resonant Frequency

Figure 4:
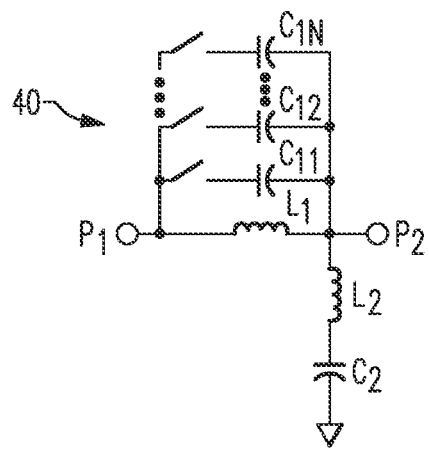
FIG. 4 is a schematic diagram of a filter circuit.
Figure 5:
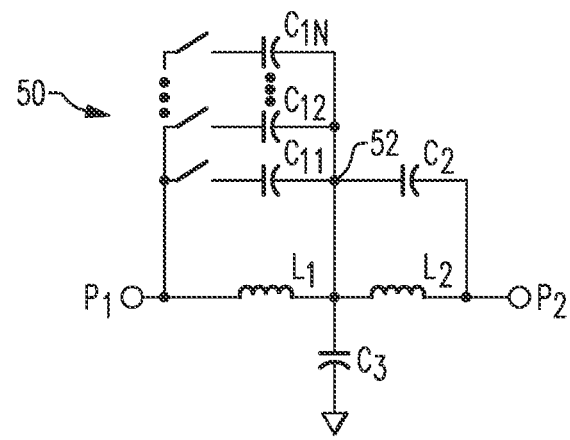
FIG. 5 is a schematic diagram of a filter circuit.
Figure 6:
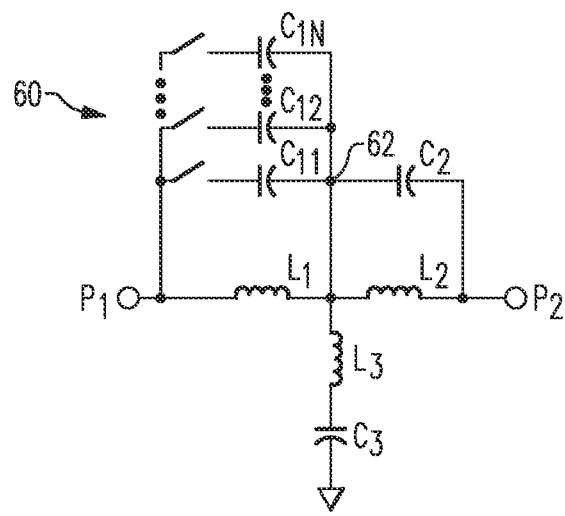
FIG. 6 is a schematic diagram of a filter circuit.

FIGS. 4 to 6 illustrate circuits that do not include the techniques of this disclosure but instead represent example circuits in which the techniques of this disclosure may be applied. These circuits represent tunable notch or bandstop filters that have a variable capacitance and, upon on changing the value of the variable capacitance, only one of the resonant frequencies is changed and so only one of the stopbands (notches) is changed.

FIG. 4 illustrates a circuit 40 for a second-order notch filter with two notches. The frequency of one of the notches is adjustable according to the value of a capacitance. The frequency of the other notch is fixed. The circuit 40 comprises a first terminal $P_1$, a second terminal $P_2$, and a ground terminal. Connected between the first terminal $P_1$ and the second terminal $P_2$ is an inductor $L_1$ and a plurality of capacitance pathways each in parallel with the inductor $L_1$. In a first capacitance pathway, a capacitor $C_{11}$ and a switch are connected in series between the first terminal $P_1$ and the second terminal $P_2$. In a second capacitance pathway, another capacitor $C_{12}$ and another switch is connected in series between the first terminal $P_1$ and the second terminal $P_2$. Dotted lines in FIG. 4 represent the plurality of similar capacitance pathways between the first terminal $P_1$ and the second terminal $P_2$ up to an Nth pathway including an Nth switch and an Nth capacitor $C_{1N}$ connected in series between the first terminal $P_1$ and the second terminal $P_2$. By closing only a single switch of the N capacitance pathways, a single capacitor of the N capacitors is selected. By closing more than one switch, more than one capacitor is selected, providing a capacitance that is the parallel combination of each of the selected capacitors. The circuit 40 also includes a second inductor $L_2$ and a second capacitor $C_2$ connected in series between the second terminal $P_2$ and the ground terminal. The second inductor $L_2$ is directly connected to the second terminal $P_2$ and the second capacitor $C_2$ is directly connected to the ground terminal.

The circuit 40 illustrated in FIG. 4 provides two separate resonant modes. The resonances of the resonant modes are uncoupled. In only one of these two resonant modes is the resonant frequency adjustable according to the capacitance provided by capacitors $C_{11}, C_{12}, \ldots, C_{1N}$, according to whichever of the capacitors is selected via the switches. The other resonant mode is independent of capacitors $C_{11}, C_{12}, \ldots, C_{1N}$. When the capacitance is adjusted, only one of the filter's notches changes.

FIG. 5 illustrates a circuit 50 for a third-order notch filter with two notches. The frequency of one of the notches is adjustable according to the value of a capacitance. The frequency of the other notch is fixed. The circuit 50 comprises a first terminal $P_1$, a second terminal $P_2$, and a ground terminal. Connected between the first terminal $P_1$ and a first node 52 is an inductor $L_1$ and a plurality of capacitance pathways each in parallel with the inductor $L_1$. In a first capacitance pathway, a capacitor $C_{11}$ and a switch are connected in series between the first terminal $P_1$ and the first node 52. In a second capacitance pathway, another capacitor $C_{12}$ and another switch are connected in series between the first terminal $P_1$ and the first node 52. Dotted lines in FIG. 5 represent the plurality of similar capacitance pathways between the first terminal $P_1$ and the node 52 up to an Nth pathway including an Nth switch and an Nth capacitor $C_{1N}$ connected in series between the first terminal $P_1$ and the first node 52. By closing only a single switch of the N capacitance pathways, a single capacitor of the N capacitors is selected. By closing more than one switch, more than one capacitor is selected, providing a capacitance that is the parallel combination of each of the selected capacitors. The circuit 50 also comprises a second capacitor $C_2$ and a second inductor $L_2$ connected in parallel with each other between the first node 52 and the second terminal $P_2$. The circuit also includes a third capacitor $C_3$ connected between the first node 52 and the ground terminal.

The circuit 50 illustrated in FIG. 5 provides two separate resonant modes. The resonances of the resonant modes are uncoupled. In only one of these two resonant modes is the resonant frequency adjustable according to the capacitance provided by capacitors $C_{11}, C_{12}, \ldots, C_{1N}$, according to whichever of the capacitors is selected via the switches. The other resonant mode is independent of capacitors $C_{11}, C_{12}, \ldots, C_{1N}$. When the capacitance is adjusted, only one of the filter's notches changes.

FIG. 6 illustrates a circuit 60 for a third-order notch filter with three notches. The frequency of one of the notches is adjustable according to the value of a capacitance. The frequencies of the other two notches are fixed. The circuit 60 is the same as the circuit 50 illustrated in FIG. 5 subject to one change. The circuit 60 of FIG. 6 also includes a first node 62 that is connected to the first terminal $P_1$ via a first inductor $L_1$ in parallel with a variable capacitance (selected by switches from one or more of capacitors $C_{11}$ to $C_{1N}$). The first node 62 is connected to the second terminal via a second inductor $L_2$ in parallel with a second capacitor $C_2$. But whereas the circuit 50 of FIG. 5 includes only a third capacitor $C_3$ connected between the first node 52 and the ground terminal, the circuit 60 of FIG. 6 includes a third inductor $L_3$ and a third capacitor $C_3$ connected in series between the first node 62 and the ground terminal. The third inductor $L_3$ is directly connected to the first node 62 and the third capacitor $C_3$ is directly connected to the ground terminal.

The circuit 60 illustrated in FIG. 6 provides three separate resonant modes. The resonances of the resonant modes are uncoupled. In only one of these three resonant modes is the resonant frequency adjustable according to the capacitance provided by capacitors $C_{11}, C_{12}, \ldots, C_{1N}$, according to whichever of the capacitors is selected via the switches. The other resonant modes are independent of capacitors $C_{11}, C_{12}, \ldots, C_{1N}$. When the capacitance is adjusted, only one of the filter's notches changes.

Filtering Circuits with Multiple Adjustable Resonant Frequencies

Figure 7:
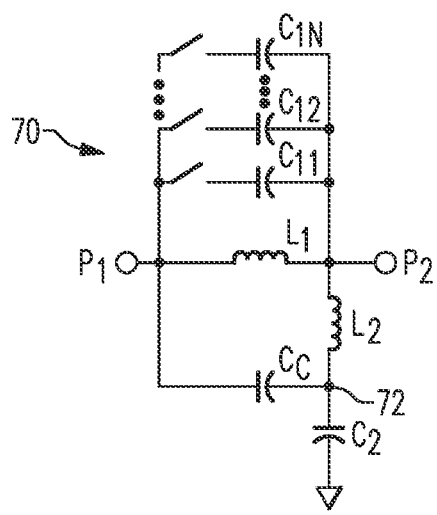
FIG. 7 is a schematic diagram of a filter circuit in accordance with the techniques of this disclosure.
Figure 8:
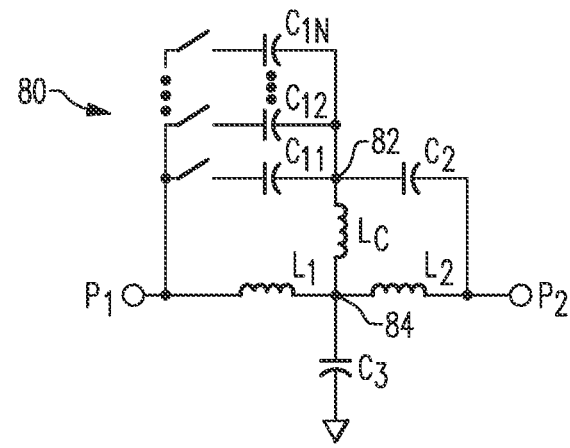
FIG. 8 is a schematic diagram of a filter circuit in accordance with the techniques of this disclosure.
Figure 9:
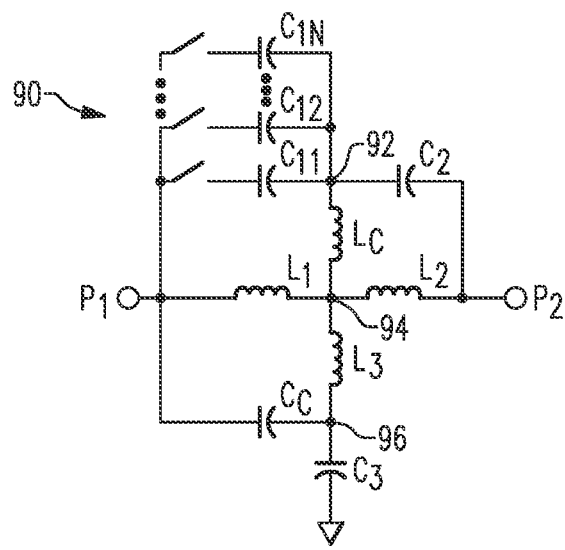
FIG. 9 is a schematic diagram of a filter circuit in accordance with the techniques of this disclosure.

FIGS. 7, 8 and 9 illustrate circuits according to the techniques of this disclosure. These circuits represent tunable notch or bandstop filters that have a variable capacitance and, upon on changing the value of the variable capacitance, all of the resonant frequencies can change. Each of FIGS. 7, 8 and 9 illustrate circuits that incorporate modifications relative to the circuits of FIGS. 4, 5 and 6 respectively that provide this functionality.

FIG. 7 illustrates a circuit 70 for a second-order notch filter with two notches. Unlike the circuit 40 of FIG. 4, the frequencies of both notches change when the variable capacitance is changed.

As with the circuit 40 of FIG. 4, the circuit 70 of FIG. 7 includes inductors $L_1$ and $L_2$, the variable capacitance represented by the parallel arrangement of capacitors $C_{11}$ to $C_{1N}$, and the capacitance $C_2$. The circuit 70 comprises a first terminal $P_1$ and a second terminal $P_2$ and a ground terminal. Connected between the first terminal $P_1$ and the second terminal $P_2$ is the inductor $L_1$ and the plurality of capacitance pathways that are each in parallel with the inductor $L_1$, each including a respective switch and a respective capacitor $C_{11}$ to $C_{1N}$. By closing only a single switch of the N capacitance pathways, a single capacitor of the N capacitors is selected. By closing more than one switch, more than one capacitor is selected, providing a capacitance that is the parallel combination of each of the selected capacitors. The second inductor $L_2$ and second capacitor $C_2$ are connected in series between the second terminal $P_2$ and the ground terminal. The second inductor $L_2$ is directly connected to the second terminal $P_2$ and the second capacitor $C_2$ is directly connected to the ground terminal.

The circuit 70 of FIG. 7 differs from that of FIG. 4 in that it further includes an additional capacitor $C_c$ connected between the first terminal $P_1$ and a node 72 that is between the second inductor $L_2$ and the second capacitor $C_2$.

The circuit 70 provides two resonant modes. In each of the two resonant modes, the resonant frequency for that mode is adjustable according to the capacitance provided by capacitors $C_{11}, C_{12}, \ldots, C_{1N}$, according to whichever of the capacitors is selected via the switches.

Using conventional circuit analysis techniques it can be shown that the notch frequencies of circuit 70 satisfy the following equation:

$$a\omega^4 - b\omega^2 + 1 = 0 \quad (1)$$

where $$a = L_1 L_2 C_1 (C_2 + C_c), \quad (2)$$

$$b = L_1 C_1 + L_2 C_2 + C_c (L_1 + L_2), \quad (3)$$

where $L_1$, $L_2$, $C_2$ and $C_c$ represent the inductances and capacitances of the corresponding components of circuit 70 and $C_1$ represents the capacitance provided by the one or more capacitors $C_{11}$ to $C_{1N}$ as determined by which one or more switches of the plurality of switches are closed.

Two positive solutions for ω are as follows:

$$\omega_{1,2} = \sqrt{\frac{b \pm \sqrt{b^2 - 4a}}{2a}}. \quad (4)$$

Since both a and b are functions of $C_1$, both of the notch frequencies are functions of $C_1$. If $C_1$ is adjusted then both $\omega_1$ and $\omega_2$ are also adjusted.

Using algebraic manipulation, the following equations can be obtained:

$$a = \frac{1}{\omega_1^2 \omega_2^2}, \quad (5)$$

$$b = \frac{1}{\omega_1^2} + \frac{1}{\omega_2^2}, \quad (6)$$

$$\gamma = \frac{b}{2\sqrt{a}}. \quad (7)$$

The ratio between the frequencies of the two notches can be defined as $$r = \omega_2/\omega_1. \quad (8)$$

From the above equations, $$r^2 - 2\gamma r + 1 = 0 \quad (9)$$

$$r = \gamma \pm \sqrt{\gamma^2 - 1} \quad (10)$$

$$\frac{\partial r}{\partial C_1} = \frac{\partial r}{\partial \gamma} \cdot \frac{\partial \gamma}{\partial C_1} = \left(1 \pm \frac{\gamma}{\sqrt{\gamma^2 - 1}}\right) \cdot \frac{\partial \gamma}{\partial C_1} \quad (11)$$

$$\frac{\partial \gamma}{\partial C_1} = \frac{L_1 L_2 (C_c + C_2)(L_1 C_1 - L_2 C_2 - C_c(L_1 + L_2))}{4\sqrt{(L_1 L_2 C_1 (C_2 + C_c))^3}} \quad (12)$$

Using these equations, and particularly the partial derivative of the frequency ratio r with respect to $C_1$, the filter can be designed so that the frequency ratio and therefore notch separation can either increase, decrease, or remain constant with respect to change in $C_1$. However, since all of the components have positive values for capacitance or inductance, the notches will move in the same direction as $C_1$ changes.

FIG. 8 illustrates a circuit 80 for a third-order notch filter with two notches. Unlike the circuit 50 of FIG. 5, the frequencies of both notches change when the variable capacitance is changed.

As with the circuit 50 of FIG. 5, the circuit 80 of FIG. 8 includes inductors $L_1$ and $L_2$, the variable capacitance represented by the parallel arrangement of capacitors $C_{11}$ to $C_{1N}$, and capacitances $C_2$ and $C_3$. The circuit 80 additionally includes a further inductor $L_c$.

The circuit 80 comprises a first terminal $P_1$ and a second terminal $P_2$ and a ground terminal. Connected between the first terminal $P_1$ and a first node 82 are a plurality of capacitance pathways, each including a respective switch and a respective capacitor $C_{11}$ to $C_{1N}$. By closing only a single switch of the N capacitance pathways, a single capacitor of the N capacitors is selected. By closing more than one switch, more than one capacitor is selected, providing a capacitance that is the parallel combination of each of the selected capacitors. Connected between the first terminal $P_1$ and a second node 84 is an inductor $L_1$. Connected between the first node 82 and the second terminal $P_2$ is a second capacitor $C_2$. Connected between the second node 84 and the second terminal $P_2$ is a second inductor $L_2$. Connected between the second node 84 and the ground terminal is a third capacitor $C_3$.

The circuit 80 in FIG. 8 differs from the circuit 50 in FIG. 5 by the inclusion of a third inductor $L_c$. In FIG. 5, the first node 82 and the second node 84 represent electrically the same point on the circuit. In FIG. 5 the first node 82 and 84 may be viewed as being shorted together. But in FIG. 8, the first node 82 and the second node 84 are not shorted together. Instead, the third inductor $L_c$ connects the first node 82 to the second node 84.

The circuit 80 provides two resonant modes. In each of the two resonant modes, the resonant frequency for that mode is adjustable according to the capacitance provided by capacitors $C_{11}, C_{12}, \ldots, C_{1N}$, according to whichever of the capacitors is selected via the switches.

Using conventional circuit analysis techniques it can be shown that the notch frequencies of circuit 80 satisfy the following equation:

$$a\omega^6 - b\omega^4 + c\omega^2 + 1 = 0 \tag{13}$$

where $$a = L_1 L_2 L_c C_1 C_2 C_3, \tag{14}$$

$$b = C_1 C_2 (L_1 L_2 + L_1 L_c + L_2 L_c), \tag{15}$$

$$c = L_1 C_1 + L_2 C_2 + L_c (C_1 + C_2), \tag{16}$$

where $L_1$, $L_2$, $L_c$ $C_2$, and $C_3$ represent the inductances and capacitances of the corresponding components of circuit 80 and $C_1$ represents the capacitance provided by the one or more capacitors $C_{11}$ to $C_{1N}$ as determined by which one or more switches of the plurality of switches are closed.

Similar analysis as set out previously in connection with circuit 70 may be performed with this circuit. The filter can be designed so that the frequency ratio and therefore notch separation can either increase, decrease, or remain constant with respect to change in $C_1$. However, since all of the components have positive values for capacitance or inductance, the notches will move in the same direction as $C_1$ changes.

FIG. 9 illustrates a circuit 90 for a third-order notch filter with three notches. Unlike the circuit 60 of FIG. 6, the frequencies of the three notches change when the variable capacitance is changed.

As with the circuit 60 of FIG. 6, the circuit 90 of FIG. 9 includes inductors $L_1$, $L_2$, and $L_3$, the variable capacitance represented by the parallel arrangement of capacitors $C_{11}$ to $C_{1N}$, and capacitance $C_2$ and $C_3$. The circuit 80 additionally includes a further inductor $L_c$ and a further capacitor $C_c$.

The circuit 90 comprises a first terminal $P_1$ and a second terminal $P_2$ and a ground terminal. Connected between the first terminal $P_1$ and a first node 92 are a plurality of capacitance pathways, each including a respective switch and a respective capacitor $C_{11}$ to $C_{1N}$. By closing only a single switch of the N capacitance pathways, a single capacitor of the N capacitors is selected. By closing more than one switch, more than one capacitor is selected, providing a capacitance that is the parallel combination of each of the selected capacitors. Connected between the first terminal $P_1$ and a second node 94 is an inductor $L_1$. Connected between the first node 92 and the second terminal $P_2$ is a second capacitor $C_2$. Connected between the second node 94 and the second terminal $P_2$ is a second inductor $L_2$. Connected between the second node 94 and the ground terminal is a third capacitor $C_3$ and a third inductor $L_3$ in series. The third capacitor $C_3$ is directly connected to the ground terminal. The third inductor $L_3$ is directly connected to the second node 94. Between the third inductor $L_3$ and the third capacitor $C_3$ there is a third node 96.

The circuit 90 in FIG. 9 differs from the circuit 60 in FIG. 6 by the inclusion of a fourth inductor $L_c$ and a fourth capacitor $C_c$. In FIG. 6, the first node 92 and the second node 94 represent electrically the same point on the circuit. In FIG. 6 the first node 92 and 94 may be viewed as being shorted together. But in FIG. 9, the first node 92 and the second node 94 are not shorted together. Instead, the fourth inductor $L_c$ connects the first node 92 to the second node 94. In addition, the fourth capacitor $C_c$ connects the first terminal $P_1$ to the third node 96 that is located between the third inductor $L_3$ and the third capacitor $C_3$.

Using conventional circuit analysis techniques it can be shown that the notch frequencies of circuit 90 satisfy the following equation:

$$a\omega^6 - b\omega^4 + c\omega^2 + 1 = 0 \tag{17}$$

where $$a = C_1 C_2 (C_3 + C_c)(L_1 L_2 L_3 + L_1 L_2 L_c + L_1 L_3 L_c + L_2 L_3 L_c), \tag{18}$$

$$\begin{aligned} b = &L_1 C_1 L_2 C_2 + L_1 C_1 L_3 C_3 + L_2 C_2 L_3 C_3 + L_c L_1 C_1 C_2 + \\ &L_c L_2 C_1 C_2 + L_c L_3 C_1 C_3 + L_c L_3 C_2 C_3 + L_c L_1 C_1 C_c + \\ &L_c L_1 C_2 C_c + L_c L_3 C_1 C_c + L_c L_3 C_2 C_c + C_c C_1 L_1 L_3 + \\ &C_c C_2 L_1 L_2 + C_c C_2 L_2 L_3, \end{aligned} \tag{19}$$

$$c = L_1 C_1 + L_2 C_2 + L_3 C_3 + L_c (C_1 + C_2) + C_c (L_1 + L_3), \tag{20}$$

where $L_1$, $L_2$, $L_3$, $L_c$, $C_2$, $C_3$, and $C_c$ represent the inductances and capacitances of the corresponding components of circuit 90 and $C_1$ represents the capacitance provided by the one or more capacitors $C_{11}$ to $C_{1N}$ as determined by which one or more switches of the plurality of switches are closed.

Similar analysis as set out previously in connection with circuit 70 may be performed with this circuit. The filter can be designed so that the frequency ratio and therefore notch separation can either increase, decrease, or remain constant with respect to change in $C_1$. However, since all of the components have positive values for capacitance or inductance, the notches will move in the same direction as $C_1$ changes.

The circuits according to the techniques of this disclosure have been analyzed and simulated on the assumption that there is no inductive coupling between any of the inductors in the circuits. It is recognized that implementations of circuits according to the techniques of this disclosure may nevertheless have unwanted inductive coupling between inductors, i.e., unwanted mutual inductance. Such circuits can be considered to have substantially no inductive coupling if any inductive coupling between any pair of inductances used in any of the coupled resonances is sufficiently low to have negligible effect or no measurable effect on the behavior of the circuits. In preferred embodiments, the maximum magnitude of any coupling coefficient between any pair of inductances or inductors in filter circuits according to the techniques of this disclosure, where the inductances or inductors are conductively coupled with the variable reactance and contribute to a resonance at a stopband that is tunable according to the value of the variable reactance, is less than a threshold, such as less than $10^{-2}$, more preferably less than $10^{-3}$, even more preferably less than $10^{-4}$, even more preferably less than $10^{-5}$, even more preferably less than $10^{-6}$, even more preferably less than $10^{-7}$, even more preferably less than $10^{-7}$, even more preferably less than $10^{-7}$, even more preferably less than $10^{-8}$, even more preferably less than $10^{-9}$, even more preferably less than $10^{-10}$, even more preferably less than $10^{-11}$, and even more preferably less than $10^{-12}$. It is recognized that the measured value of a coupling coefficient may vary with the frequency at which it is measured. To confirm whether a circuit according to the techniques of this disclosure has substantially no inductive coupling, coupling coefficients between pairs of inductors may be measured at an appropriate frequency for the circuit. For example, the magnitudes of such coupling coefficients may all be less than $10^{-2}$, $10^{-3}$, $10^{-4}$, $10^{-5}$, $10^{-6}$, $10^{-7}$, $10^{-8}$, $10^{-9}$, $10^{-11}$, or $10^{-12}$ when measured at the base frequency of any band of operation (such as LTE bands B12, B8, etc.) of the circuit, or when measured at the base frequency of a specific band of operation such as the lowest-frequency band of operation, or when measured at one or more specific frequencies such as one or more of 500 MHz, 1000 MHz, 2000 MHz, 4000 MHz and 8000 MHz. For example, circuits according to the techniques of this disclosure may be configured to provide harmonic notch filtering for LTE band B12 signals and LTE band B8 signals, depending on a value of a variable reactance. The base frequency of B12 is 700 MHz and the base frequency of B8 is 900 MHz. To confirm that such a circuit has substantially no inductive coupling, magnitudes of coupling coefficients between pairs of inductors may be measured at either or both of 700 MHz or 900 MHz and compared to one of the above thresholds ($10^{-2}$, $10^{-3}$, $10^{-4}$, $10^{-5}$, $10^{-6}$, $10^{-7}$, $10^{-8}$, $10^{-9}$, $10^{-11}$, or $10^{-12}$) to confirm that the level of inductive coupling is sufficiently small to be negligible.

On the other hand, it is not essential that there is substantially no inductive coupling. Compensation can be made for some degree of inductive coupling during a design process, e.g., by appropriate simulation of inductive coupling and by appropriate selection of component values taking into account the simulated inductive coupling; such simulations may additionally or alternatively take into account other effects such as parasitic capacitance and parasitic capacitive coupling and a design process may include selection of component values to provide a suitable performance taking into account such effects.

Example Designs of Tunable Filters for Certain LTE Bands

Filter circuits according to the techniques of this disclosure may be implemented to provide filtering, such as harmonic notch filtering, for signals to be transmitted and received over frequency bands used in wireless communications, such as frequency bands used in LTE telecommunications networks or frequency bands used in any of the other telecommunications protocols described herein.

Purely by way of example, a second-order filter for LTE bands B12 and B8 can be obtained by switching one capacitance $C_1$ to one of two states (e.g., by switching into the circuit a different one of capacitors $C_{11}$ and $C_{12}$) using the circuit 70 of FIG. 7. For each of bands B12 and B8, the second-order filter provides a notch at 2f0 and 3f0 relative to the frequency f0 of the respective band. B12 has a frequency of 700 MHz and B8 has a frequency of 900 MHz. Therefore the notches are to be placed at 2f0 and 3f0, i.e., 1400 MHz and 2100 MHz for B12 and at 1800 MHz and 2700 MHz for B8. In accordance with the techniques presented in this disclosure, appropriate selection of components yields a filter circuit having tunable notches that can be located at the 2f0 and 3f0 frequencies of bands B12 and B8 according to the capacitance provided for $C_1$ in circuit 70 of FIG. 7. Values of components for circuit 70 to have this functionality are set out in TABLE 1 below.

TABLE 1

| Case | LTE Band | $C_1$ (pF) | $L_1$ (nH) | $C_2$ (pF) | $L_2$ (nH) | $C_c$ (pF) |
|---|---|---|---|---|---|---|
| 1 | 12 | 3.4 | 3.35 | 1.34 | 4 | 0.2 |
| 2 | 8 | 1.3 | | | | |

Figure 10:
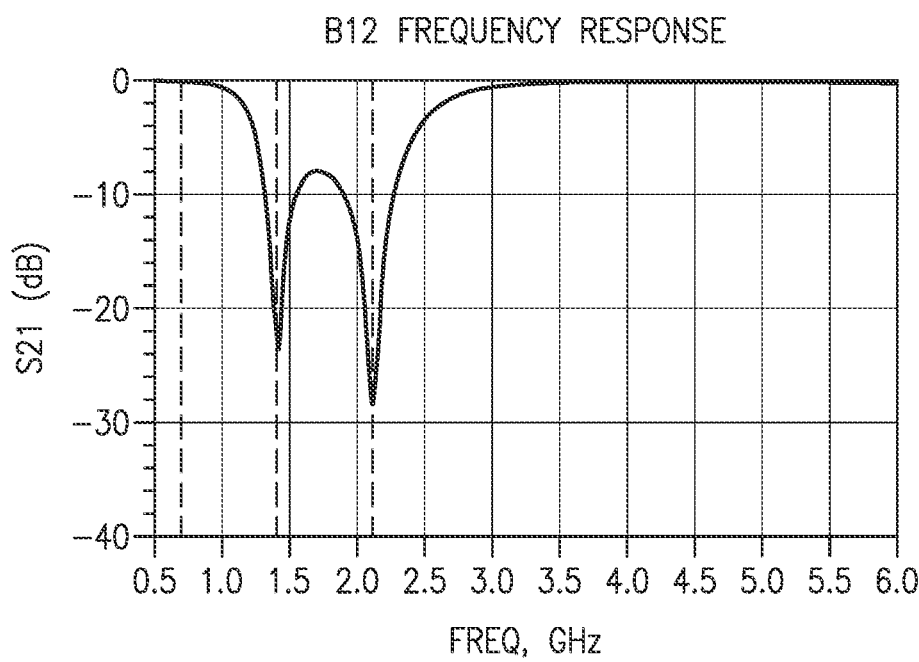
FIG. 10 is a graph of simulated frequency response for a first circuit in accordance with the techniques of this disclosure, in which the circuit is tuned for a B12 band.

FIG. 10 is a graph of results of a simulation of the frequency response of the circuit 70 of FIG. 7 with component values set according to the values of TABLE 1 for case 1, i.e., when the switches of circuit 70 are configured such that the capacitance $C_1$ is 3.4 pF. The vertical axis of the graph represents the forward voltage gain between terminals 1 and 2, i.e., S21, in dB. The horizontal axis of the graph represents frequency. It can be seen from the frequency response in FIG. 10 that the two notches are present and they are located at 1400 MHz and 2100 MHz, i.e., the 2f0 and 3f0 frequencies for B12. The gain at the 2f0 and 3f0 notches is between −20 dB and −30 dB. The gain at 700 MHz is between −0.1 dB and −0.15 dB. When configured for B12, this filter provides minimal attenuation at the B12 frequency of 700 MHz but provides more significant attenuation at the 2f0 and 3f0 harmonics of 700 MHz.

Figure 11:
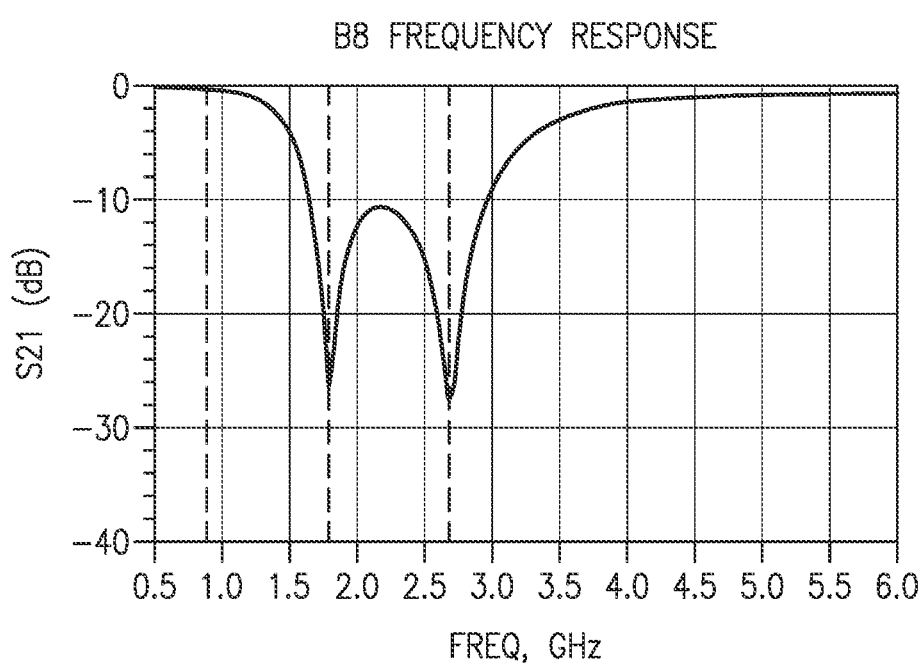
FIG. 11 is a graph of simulated frequency response for the first circuit in accordance with the techniques of this disclosure, in which the circuit is tuned for a B8 band.

FIG. 11 is a graph of results of a simulation of the frequency response of the circuit 70 of FIG. 7 with component values set according to the values of TABLE 1 for case 2, i.e., when the switches of circuit 70 are configured such that the capacitance $C_1$ is 1.3 pF. As with FIG. 10, the vertical axis of the graph represents the forward voltage gain between terminals 1 and 2, i.e., S21, in dB. The horizontal axis of the graph represents frequency. It can be seen from the frequency response in FIG. 11 that the two notches are present and they are located at 1800 MHz and 2700 MHz, i.e., the 2f0 and 3f0 frequencies for B8. The gain at the 2f0 and 3f0 notches is below −25 dB in each case. The gain at 900 MHz is between approximately −0.2 dB. When configured for B8, this filter provides minimal attenuation at the B8 frequency of 900 MHz but provides more significant attenuation at the 2f0 and 3f0 harmonics of 900 MHz.

When circuit 70 is configured with components having values as specified in TABLE 1, the circuit can be switched from a 2f0 and 3f0 harmonic filter for band B12 to a 2f0 and 3f0 harmonic filter for band B8 by varying only a single capacitance—in this case by controlling the switches to select one or more capacitors to provide a capacitance $C_1$ of 1.3 pF for B12 and 3.4 pF for B8.

As another example, a third-order filter for LTE bands B12 and B8 can be obtained by switching one capacitance $C_1$ to one of two states (e.g., by switching into the circuit a different one of capacitors $C_{11}$ and $C_{12}$) using the circuit 80 of FIG. 8. As with the previous example, for each of bands B12 and B8, the third-order filter provides a notch at 2f0 and 3f0 relative to the frequency f0 of the respective band. Values for such components for circuit 80 to have this functionality are set out in TABLE 2 below.

TABLE 2

| Case | LTE Band | $C_1$ (pF) | $L_1$ (nH) | $C_2$ (pF) | $L_2$ (nH) | $C_3$ (pF) | $L_c$ (nF) |
|---|---|---|---|---|---|---|---|
| 1 | 12 | 1.91 | 6.1 | 1.14 | 6 | 3.7 | 0.17 |
| 2 | 8 | 0.85 | | | | | |

Figure 12:
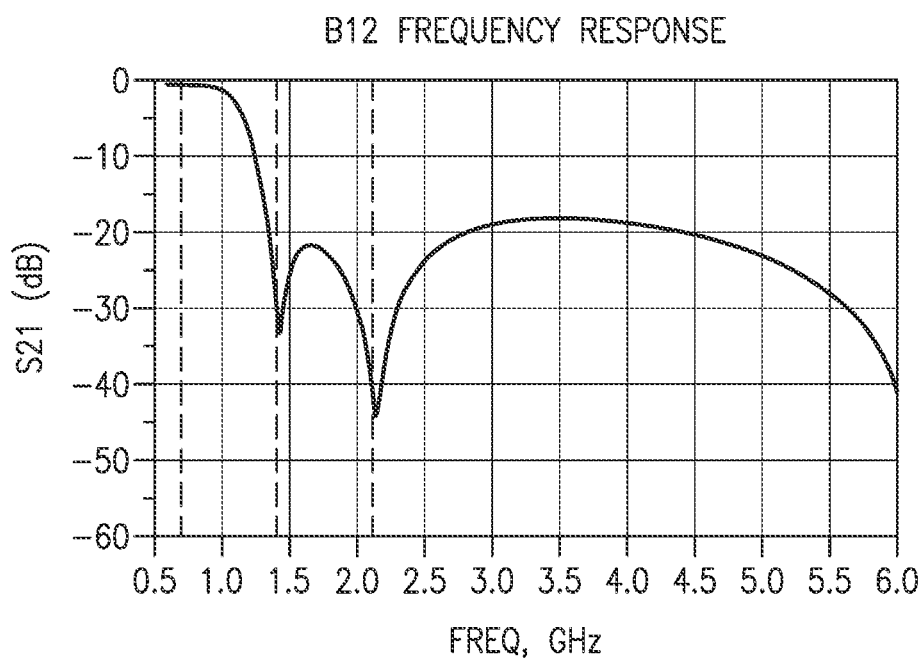
FIG. 12 is a graph of simulated frequency response for a second circuit in accordance with the techniques of this disclosure, in which the circuit is tuned for a B12 band.

FIG. 12 is a graph of results of a simulation of the frequency response of the circuit 80 of FIG. 8 with component values set according to the values of TABLE 2 for case 1, i.e., when the switches of circuit 80 are configured such that the capacitance $C_1$ is 1.91 pF. The vertical axis of the graph represents the forward voltage gain between terminals 1 and 2, i.e., S21, in dB. The horizontal axis of the graph represents frequency. The two notches are present and they are located at 1400 MHz and 2100 MHz, i.e., the 2f0 and 3f0 frequencies for B12. The gain at the 2f0 and 3f0 notches is below −35 dB in each case. The gain at 700 MHz is approximately −0.3 dB.

Figure 13:
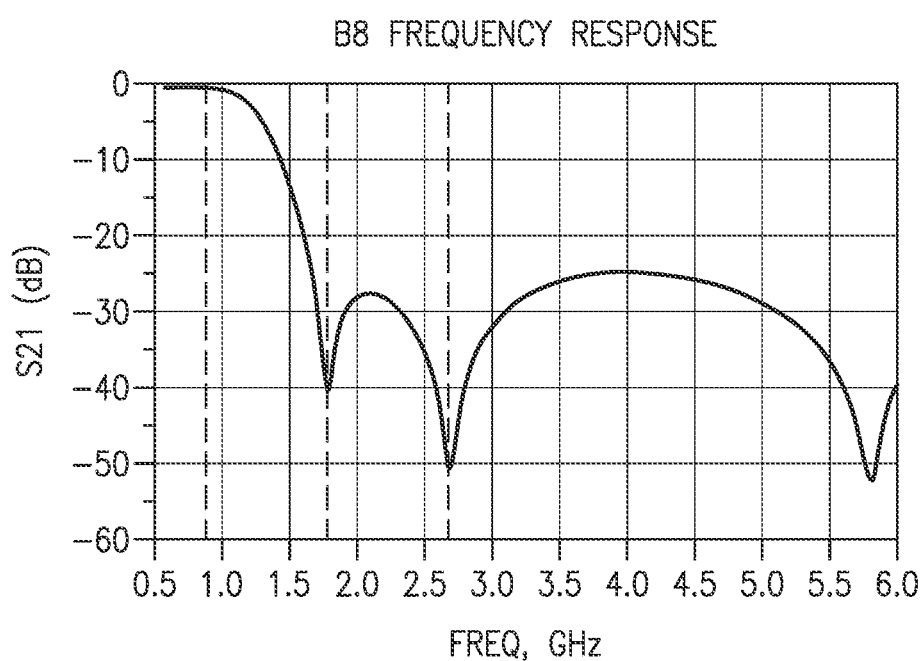
FIG. 13 is a graph of simulated frequency response for the second circuit in accordance with the techniques of this disclosure, in which the circuit is tuned for a B8 band.

FIG. 13 is a graph of results of a simulation of the frequency response of the circuit 80 of FIG. 8 with component values set according to the values of TABLE 2 for case 2, i.e., when the switches of circuit 80 are configured such that the capacitance $C_1$ is 0.85 pF. The two notches are present and they are located at 1800 MHz and 2700 MHz, i.e., the 2f0 and 3f0 frequencies for B8. The gain at the 2f0 and 3f0 notches is below −35 dB in each case. The gain at 900 MHz is approximately −0.4 dB.

When circuit 80 is configured with components having values as specified in TABLE 2, the circuit can be switched from a 2f0 and 3f0 harmonic filter for band B12 to a 2f0 and 3f0 harmonic filter for band B8 by varying only a single capacitance—in this case by controlling the switches to select one or more capacitors to provide a capacitance $C_1$ of 1.91 pF for B12 and 0.85 pF for B8.

As another example, a third-order filter for LTE bands B12 and B8 can be obtained by switching one capacitance $C_1$ to one of two states (e.g., by switching into the circuit a different one of capacitors $C_{11}$ and $C_{12}$) using the circuit 90 of FIG. 9. Unlike the previous examples, this circuit provides three notches. For each of bands B12 and B8, the third-order filter provides notches at 2f0, 3f0 and 4f0 relative to the frequency f0 of the respective band. Values for such components for circuit 90 to have this functionality are set out in TABLE 3 below.

TABLE 3

| Case | LTE Band | $C_1$ (pF) | $L_1$ (nH) | $C_2$ (pF) | $L_2$ (nH) | $C_3$ (pF) | $L_3$ (nH) | $L_c$ (nH) | $C_c$ (pF) |
|---|---|---|---|---|---|---|---|---|---|
| 1 | 12 | 1.5 | 7 | 0.98 | 7.56 | 3.43 | 0.66 | 0.15 | 0.15 |
| 2 | 8 | 0.36 | | | | | | | |

Figure 14:
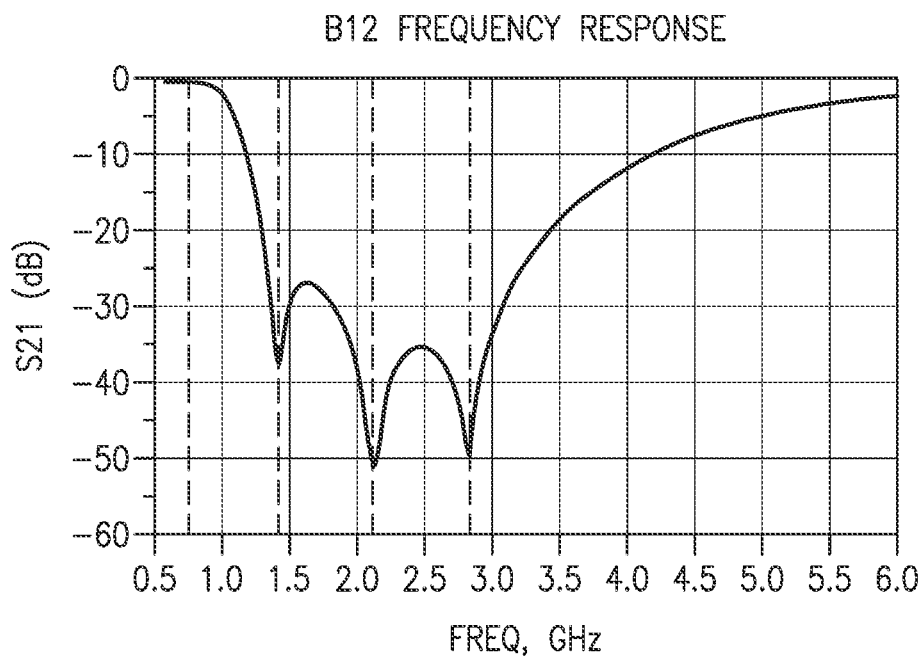
FIG. 14 is a graph of simulated frequency response for a third circuit in accordance with the techniques of this disclosure, in which the circuit is tuned for a B12 band.

FIG. 14 is a graph of results of a simulation of the frequency response of the circuit 90 of FIG. 9 with component values set according to the values of TABLE 3 for case 1, i.e., when the switches of circuit 90 are configured such that the capacitance $C_1$ is 1.5 pF. The vertical axis of the graph represents the forward voltage gain between terminals 1 and 2, i.e., S21, in dB. The horizontal axis of the graph represents frequency. The three notches are present and they are located at 1400 MHz, 2100 MHz and 2800 MHz, i.e., the 2f0, 3f0 and 4f0 frequencies for B12. The gain at the 2f0 notch is below −30 dB and the gain at the 3f0 and 4f0 notches is below −40 dB in each case. The gain at 700 MHz is approximately −0.45 dB.

Figure 15:
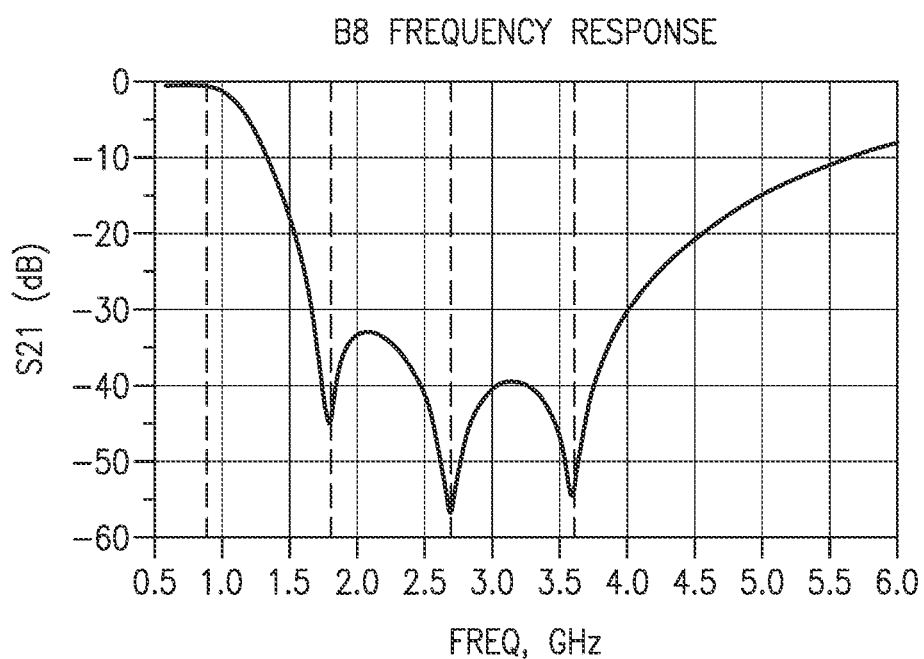
FIG. 15 is a graph of simulated frequency response for the third circuit in accordance with the techniques of this disclosure, in which the circuit is tuned for a B8 band.

FIG. 15 is a graph of results of a simulation of the frequency response of the circuit 90 of FIG. 9 with component values set according to the values of TABLE 3 for case 2, i.e., when the switches of circuit 90 are configured such that the capacitance $C_1$ is 0.36 pF. The three notches are present and they are located at 1800 MHz, 2700 MHz and 3600 MHz, i.e., the 2f0, 3f0 and 4f0 frequencies for B8. The gain at the 2f0 notch is below −30 dB and the gain at the 3f0 and 4f0 notches is below −40 dB in each case. The gain at 900 MHz is approximately −0.6 dB.

When circuit 90 is configured with components having values as specified in TABLE 3, the circuit can be switched from a 2f0, 3f0 and 4f0 harmonic filter for band B12 to a 2f0, 3f0 and 4f0 harmonic filter for band B8 by varying only a single capacitance—in this case by controlling the switches to select one or more capacitors to provide a capacitance $C_1$ of 1.5 pF for B12 and 0.36 pF for B8.

Further Filtering Circuits with Multiple Adjustable Resonant Frequencies

The circuits of FIGS. 7, 8 and 9 show only reactive components—inductors and capacitors. The reader will recognize that resistive impedances will be present in any practical implementation of these circuits. Any of the circuits described herein may additionally include resistor elements. For example, circuit 70 of FIG. 7 or circuit 80 of FIG. 8 or circuit 90 of FIG. 9 may include a resistor in series with any or all of the capacitances and inductances. Such resistors may reduce the Q factor of filter at any of the notches. For the purpose of simulation, the graphs of FIGS. 10 to 15 were calculated based on an inductor Q of 25 and a capacitor Q of 180.

The circuits of FIGS. 7, 8 and 9 provide capacitances and inductances at the specified locations within the circuits. Each of the capacitances may either be provided by a single capacitor circuit element or may comprise multiple capacitors that can be combined together to provide an aggregate capacitance value, or may comprise multiple capacitors and resistors to provide an aggregate capacitance value. Similarly, each of the inductances may either be provided by a single inductor circuit element or may comprise multiple inductors that can be combined together to provide an aggregate inductance value, or may comprise multiple inductors and resistors to provide an aggregate inductance value.

The circuits of FIGS. 7, 8 and 9 may include additional components as part of the couplings between circuit nodes. As discussed above, these additional components can include resistances. They can also include reactive components. The presence of these additional components may complicate the circuit analysis and may provide introduce further resonant modes, which might or might not be desirable. But such additional components might also allow additional degrees of freedom for optimization of the filter circuit.

Figure 16:
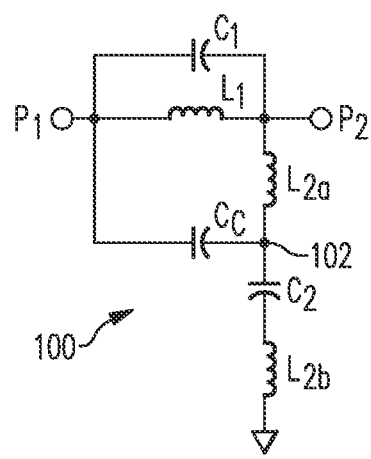
FIG. 16 is a schematic diagram of a filter circuit in accordance with the techniques of this disclosure.

FIG. 16 illustrates a circuit 100 for a second-order notch filter with two notches. The circuit 100 of FIG. 16 includes inductors $L_1$, $L_{2a}$, and $L_{2a}$, the variable capacitance represented by a single capacitor $C_1$, the capacitance $C_2$ and the capacitance $C_c$. Capacitor $C_1$ represents a variable capacitance as in previously described circuits although the array of capacitors in parallel is not shown in FIG. 16. The circuit 100 comprises a first terminal $P_1$ and a second terminal $P_2$ and a ground terminal. Connected between the first terminal $P_1$ and the second terminal $P_2$ is the inductor $L_1$ and the variable capacitance $C_1$ in parallel with the inductor $L_1$. The inductor $L_{2a}$ and second capacitor $C_2$ and inductor $L_{2b}$ are connected in series between the second terminal $P_2$ and the ground terminal. The inductor $L_{2a}$ is directly connected to the second terminal $P_2$ and the second capacitor $C_2$ is connected to the ground terminal via the inductor $L_{2b}$. The capacitor $C_c$ is connected between the first terminal $P_1$ and a node 102 that is between the inductor $L_{2a}$ and the second capacitor $C_2$.

The circuit 100 of FIG. 16 is essentially the same as the circuit 70 of FIG. 7, subject to the following difference. In circuit 70, the capacitor $C_2$ is coupled directly between node 72 and the ground terminal. A first end of the capacitor is connected to the node 72. A second end is connected to the ground terminal. But in FIG. 16, the capacitor $C_2$ is not coupled directly to the ground terminal. It is coupled to the ground terminal via a further inductor $L_{2b}$ in series with the capacitor $C_2$. To aid understanding of the effect of this change, it may be thought of as a splitting of the inductance $L_2$ in FIG. 70 between two separate inductors $L_{2a}$ and $L_{2b}$, where inductor $L_{2a}$ forms part of a loop with capacitor $C_c$ and inductor $L_{2b}$ does not. The positions of inductor $L_{2b}$ and capacitor $C_2$ may be swapped in this circuit without affecting the above analysis and so some implementations of the circuit 100 may swap the positions of inductor $L_{2b}$ and capacitor $C_2$, or split $L_{2b}$ further into partial inductances either side of capacitor $C_2$.

In the selection of component values it has been found that capacitor $C_2$ is the main component to control the trade-off between the strength of the notch rejection and the insertion loss. Therefore to achieve a desired trade-off between the strength of the notch rejection and the insertion loss, a value of $C_2$ may be chosen and fixed. By splitting the inductor $L_2$ in FIG. 7 into separate inductors $L_{2a}$ and $L_{2b}$ in FIG. 16, an additional degree of freedom is added, which allows for a larger value of $C_c$ while providing the same filtering performance as in FIG. 7 (including having notches that each change frequency when capacitance $C_1$ changes). In addition, a large value of $L_{2b}$ will decrease the values needed for $C_1$ ($C_{11}$, $C_{12}$, ... $C_{1N}$, etc. when implemented as an array of switched capacitances in parallel as in FIG. 7) for a given filtering performance.

Figure 17:
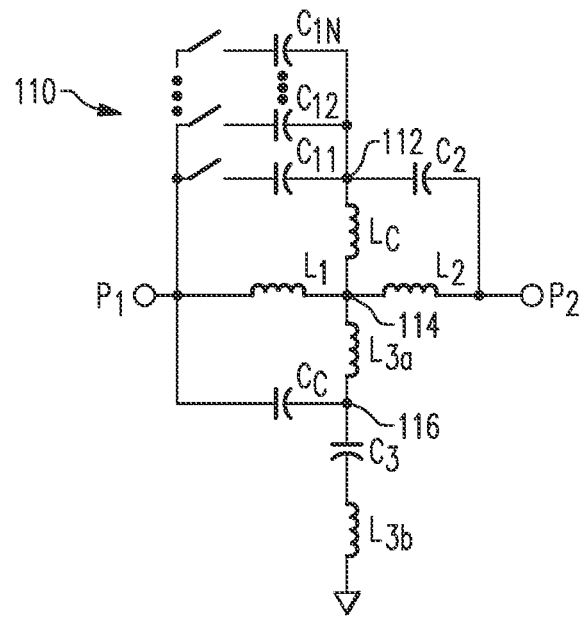
FIG. 17 is a schematic diagram of a filter circuit in accordance with the techniques of this disclosure.

FIG. 17 illustrates a circuit 110 for a third-order notch filter with three notches. As with the circuit 90 of FIG. 9, the circuit 100 includes inductors $L_1$, $L_2$, and $L_c$, the variable capacitance represented by the parallel arrangement of capacitors $C_{11}$ to $C_{1N}$, and capacitances $C_2$, $C_3$ and $C_c$. Compared with circuit 90 of FIG. 9, the inductance $L_3$ of FIG. 9 has been split into separate inductances $L_{3a}$ and $L_3$b in circuit 110. The first separate inductance $L_{3a}$ is located in the same position as $L_3$ in circuit 90 and the second separate inductance $L_3$b is located in series between capacitor $C_3$ and the ground terminal. Nodes 112, 114 and 116 of circuit 110 correspond to nodes 92, 94 and 96 in circuit 90.

Similar to circuit 100 shown in FIG. 16, the presence of this additional inductance $L_3$b provides an additional degree of freedom in the design of a filtering circuit when using the general topology shown in FIG. 9. This effect can be achieved wherever the inductance $L_3$b is in series with capacitor $C_3$ between node 116 and the ground terminal. Inductance $L_3$b may be between capacitor $C_3$ and the ground terminal or between capacitor $C_3$ and node 116 or may be split into a portion that is between capacitor $C_3$ and the ground terminal and a portion that is between capacitor $C_3$ and node 116. Whichever arrangement of inductance $L_3$b and capacitance $C_3$ is chosen, a portion of inductance $L_3$ in circuit 90 is retained in-loop with capacitance $C_c$ (i.e., inductance $L_{3a}$ in circuit 110 is in-loop with capacitance $C_c$) and a portion of inductance $L_3$ in circuit 90 is not in-loop with capacitance Cc (i.e., inductance $L_3$b in circuit 110 is not in-loop with capacitance $C_c$).

The circuits according to the techniques of this disclose that have been described thus far all have variable capacitances. But, without wishing to be bound by theory, it is believed the principles of these circuits, and particularly the moving of multiple notches by changing the value of a single reactive circuit element in the topology, is also applicable to variable inductances. In particular, filter circuits with multiple moveable notches may be achieved by swapping the existing inductors with capacitors and swapping the existing capacitors with inductors in the previously described circuits according to the techniques of this disclosure. Examples according to the techniques of this disclosure include the circuits of FIGS. 7 to 9, 16 and 17, wherein each existing inductor is swapped with a capacitor and each existing capacitor is swapped with an inductor.

Figure 18:
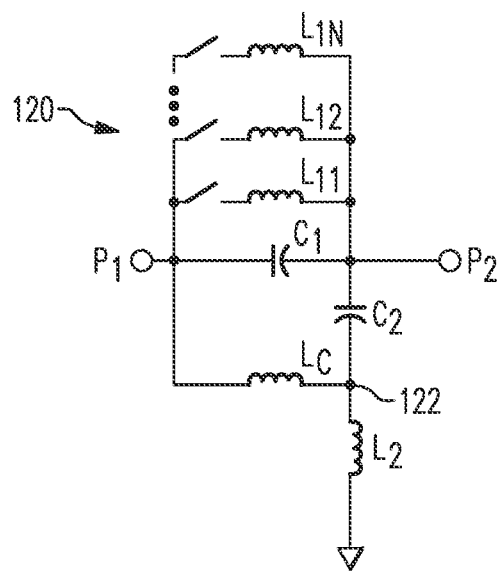
FIG. 18 is a schematic diagram of a filter circuit in accordance with the techniques of this disclosure.

FIG. 18 for example illustrates a circuit 120 for a filter with two moveable notches that change their frequency when a component value is changed. Circuit 120 is topologically similar to circuit 70 of FIG. 7, except that each inductance in circuit 70 is replaced by a capacitance in circuit 120 and each capacitance in circuit 70 is replaced by an inductance in circuit 120.

Circuit 120 includes capacitors $C_1$ and $C_2$, the variable inductance represented by the parallel arrangement of inductors $L_{11}$ to $L_{1N}$, and the inductances $L_2$ and $L_c$. The circuit 120 comprises a first terminal $P_1$ and a second terminal $P_2$ and a ground terminal. Connected between the first terminal $P_1$ and the second terminal $P_2$ is the capacitor $C_1$ and the plurality of inductance pathways that are each in parallel with the capacitor $C_1$, each including a respective switch and a respective inductor $L_{11}$ to $L_{1N}$. The second capacitor $C_2$ and second inductor $L_2$ are connected in series between the second terminal $P_2$ and the ground terminal. The second capacitor $C_2$ is directly connected to the second terminal $P_2$ and the second inductor $L_2$ is directly connected to the ground terminal. The additional inductor $L_c$ connected between the first terminal $P_1$ and a node 122 that is between the second capacitor $C_2$ and the second inductor $L_2$.

The circuit 120 provides two resonant modes in which the resonant frequency for that mode is adjustable according to the inductance provided by inductors $L_{11}$, $L_{12}$, ..., $L_{1N}$, according to whichever of the inductors is selected via the switches.

It is noted that, at least for some applications, the circuit 120 of FIG. 18 may have drawbacks compared to circuit 70 of FIG. 7. For example, DC components of any signals at $P_1$ will not be transmitted to $P_2$ or at least be heavily attenuated due to the purely inductive pathway between $P_1$ and the ground terminal. Low frequency signals will also be heavily attenuated by this pathway to the ground terminal because the impedance of this path may remain low at low frequencies. If this behavior is not desired in an application then circuit 70 may represent a more appropriate topology for a filter circuit for that application. Even so, the presence of two moveable notches in combination with DC and low frequency rejection has some applications and whether it is appropriate for an application will depend on particular filtering requirements of that application. It is also noted that, following the principles illustrated in FIGS. 16 and 17, an additional capacitance may be added in series between the second inductor $L_2$ and the ground terminal, essentially 'splitting' the capacitance of the second capacitor $C_2$ between an in-loop component and an out-of-loop component, which may reduce or avoid the rejection of DC and low-frequency components.

Use of Filter Circuits According to the Techniques of this Disclosure

Figure 19:
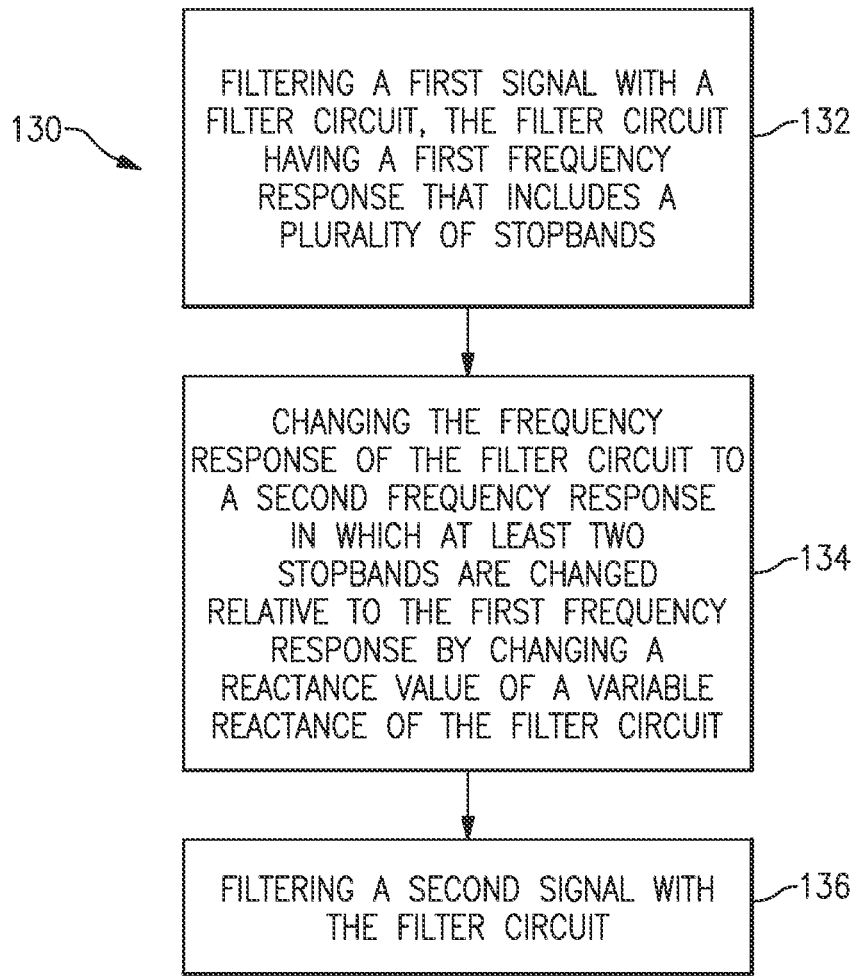
FIG. 19 is a flow diagram of a method in accordance with the techniques of this disclosure.

FIG. 19 illustrates a flow diagram of a process or method 130 in which a filter circuit according to the techniques of this disclosure is used.

A first step 132 comprises filtering a first signal with a filter circuit, the filter circuit having a first frequency response that includes a plurality of stopbands.

A second step 134 comprises changing the frequency response of the filter circuit to a second frequency response in which at least two stopbands are changed relative to the first frequency response by changing a reactance value of a variable reactance of the filter circuit. Changing the reactance value may change two stopbands or may change more than two stopbands, such as three stopbands, or four stopbands, or more. In some embodiments, changing the reactance value may change all stopbands of the plurality of stopbands.

The filter circuit may include a plurality of capacitances and a plurality of inductances including the variable reactance. The filter circuit may further include a plurality of resonant modes that each correspond to resonance at a resonant frequency between the variable reactance and one or more of the plurality of inductances and one or more of the plurality of capacitances. The variable reactance may be conductively coupled with one or more other impedances and capacitances of the pluralities of impedances and capacitances such that a change in the variable reactance causes a change in a resonant frequency of more than one of (or even each of) the plurality of resonant modes, with each stopband of the filter circuit at a different resonant frequency of the plurality of resonant modes. The variable reactance of the filter circuit may be conductively coupled with each of the plurality of resonant modes by at least one impedance or capacitance that prevents any other impedances and capacitances forming resonant modes independent of the variable reactance. Mutual coupling between inductances of the plurality of inductances may be substantially zero. The variable reactance may be a variable inductance of the plurality of inductances or a variable capacitance of the plurality of capacitances. The frequency response of the filter circuit may be changed to the second frequency response by changing only the reactance value of the variable reactance A third step 136 comprises filtering a second signal with the filter circuit. As a result, the second signal undergoes a different filtering with different stopbands than the first signal.

The first and second signals may be RF signals and the stopbands may be in an RF range of frequencies.

The filter circuit may be configured according to any of the previously described circuits according to the techniques of this disclosure, including the circuits illustrated in FIGS. 7 to 9 and FIGS. 16 to 18.

The filter circuit may be configured to be subsequently switched to a third frequency response that is different to the first and second frequency responses on change of the reactance value of the variable reactance. Further filtering of a third signal may result in the third signal undergoing a different filtering with different stopbands than the filtering undergone by the first signal and the second signal.

The stopbands of the first, second and third frequency responses may be located at frequencies corresponding to harmonics of base frequencies of any bands of wireless communications protocols including but not limited to bands of 4G LTE, 5G NR, and wireless local area network (WLAN), such as Wi-Fi. For example, the stopbands could be located at frequencies corresponding to harmonics of a base frequency of any LTE bands 8, 12 and 28, with each frequency response corresponding to harmonic stopband (notch) filtering for signals according to a different LTE band of 8, 12 and 28, depending on harmonic filtering requirements for each signal.

Radio Frequency Systems with Filters

The filter circuits disclosed herein can be included in radio frequency systems, such as in a radio frequency front end. A filter circuit in accordance with any suitable principles and advantages disclosed herein be implemented at any suitable location in a system that could benefit from the harmonic rejection provided by filters disclosed herein.

Figure 20A:
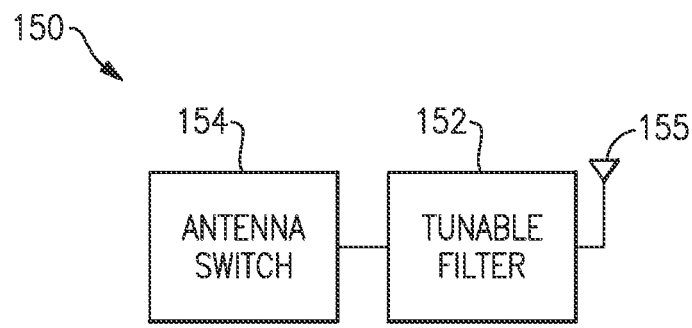
FIG. 20A is a schematic block diagram of a radio frequency system with a tunable filter including a filter circuit in accordance with the techniques of this disclosure.

FIG. 20A is a schematic block diagram of a radio frequency system 150 with a tunable filter 152. As shown in FIG. 20A, the tunable filter 152 is coupled between an antenna switch 154 and an antenna 155. The tunable filter 152 comprises a filter circuit in accordance with any suitable principles and advantages disclosed herein to provide harmonic rejection for radio frequency signal propagating between the antenna switch 154 and the antenna 155. It should be appreciated that the position of the antenna switch 154 and the tunable filter 152 may be reversed, such that the antenna switch 154 is disposed between the tunable filter 152 and the antenna 155.

Figure 20B:
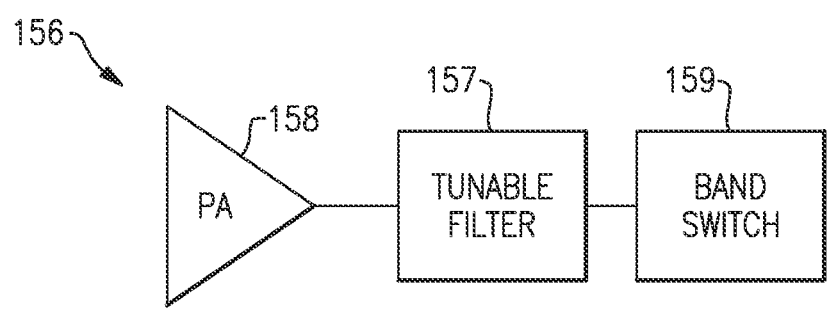
FIG. 20B is a schematic block diagram of a radio frequency system with a tunable filter including a filter circuit in accordance with the techniques of this disclosure.

FIG. 20B is a schematic block diagram of a radio frequency system 156 with a tunable filter 157. As shown in FIG. 20B, the tunable filter 157 is coupled between a power amplifier 158 and a band select switch 159. The band select switch 159 can electrically connect an output of the power amplifier 158 to a radio frequency signal path for a particular operating band. Such a radio frequency signal path can include a band pass filter having a passband corresponding to the operating band. The band select switch 159 is an example of a multi-throw switch that can selective electrically connect the tunable filter 157 to a selected radio frequency signal path. The tunable filter 157 comprises a filter circuit accordance with any suitable principles and advantages disclosed herein to provide harmonic rejection for radio frequency signal propagating between an output of the power amplifier 158 and the band select switch 159.

Wireless Communication Devices

The filter circuits disclosed herein can be included in wireless communication devices, such as mobile devices. One or more filter circuits in accordance with any suitable principles and advantages disclosed herein can be implemented in any suitable wireless communication device. An example of such a wireless communication device will be discussed with reference to FIG. 21.

Figure 21:
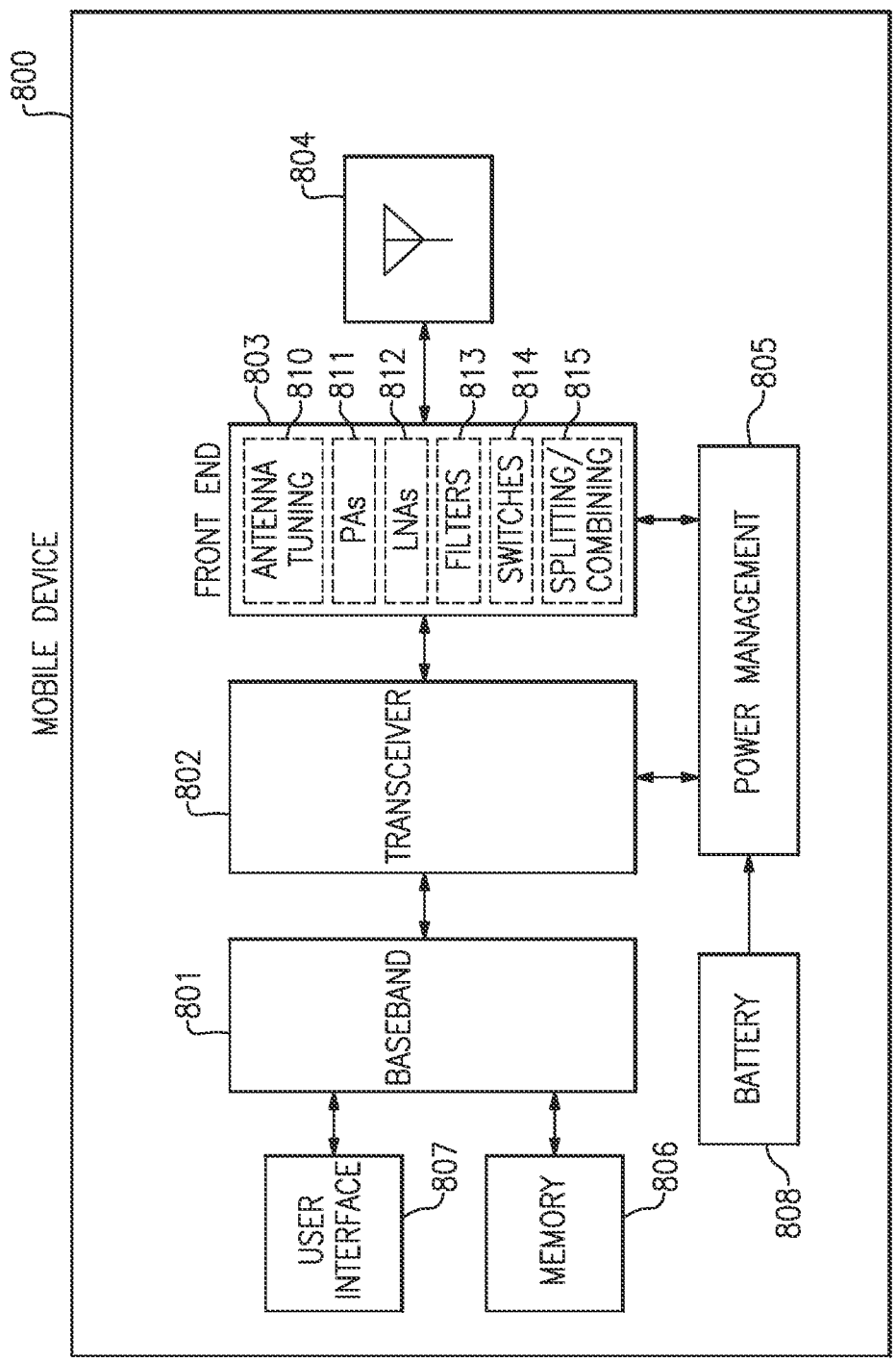
FIG. 21 is a schematic diagram of one embodiment of a mobile device.

FIG. 21 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 21 as the transceiver 802. In one example, separate components (for instance, separate circuits or dies) can be provided for handling certain types of RF signals.

The front end system 803 aids in conditioning signals transmitted to and/or received from the antennas 804. In the illustrated embodiment, the front end system 803 includes antenna tuning circuitry 810, power amplifiers (PAs) 811, low noise amplifiers (LNAs) 812, filters 813, switches 814, and signal splitting/combining circuitry 815. However, other implementations are possible. The filters 813 can include one or more filter circuits with harmonic rejection with that include one or more features of the embodiments disclosed herein.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 21, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 21, the power management system 805 receives a battery voltage from the battery 808. The battery 808 can be any suitable battery for use in the mobile device 800, including, for example, a lithium-ion battery.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A filter circuit comprising:
a first node;
a second node;
a variable reactance coupled to the first node, the variable reactance including at least one impedance of a first type;
a first impedance coupled to the first node, the first impedance being of a second type of impedance different than the first type;
a second impedance of the second type coupled between the variable reactance and the first impedance; and
a third impedance of the second type coupled at a first end to the first impedance and the second impedance, and coupled at a second end to the second node, the variable reactance being configured to operate in a plurality of resonant modes that each correspond to a resonant frequency, the resonant frequency being based on a reactance of the variable reactance and reactances of one or more elements of a set including the first impedance, the second impedance, and the third impedance.

2. The filter circuit of claim 1 wherein the variable reactance includes one or more switching devices coupled to the at least one impedance of the first type, the one or more switching devices being configured to selectively couple and decouple at least one terminal of the at least one impedance of the first type from the filter circuit.

3. The filter circuit of claim 1 wherein the second type of impedance is inductive, and mutual coupling between at least two of the first impedance, the second impedance, and the third impedance is substantially zero.

4. The filter circuit of claim 1 wherein the variable reactance is a variable capacitance that includes one or more elements of a capacitive set, the capacitive set including of a mechanically controllable variable capacitor, an electrically controllable varactor or variable capacitor, and a plurality of selectively engageable capacitors.

5. The filter circuit of claim 1 wherein the variable reactance is a variable inductance that includes one or more elements of an inductive set, the inductive set including a mechanically controllable variable inductor, an electrically controllable variable inductor, and a plurality of selectively engageable inductors.

6. The filter circuit of claim 1 wherein the first type of impedance is inductive and the second type of impedance is capacitive.

7. The filter circuit of claim 1 wherein the filter circuit is a bandstop filter circuit that has a frequency response that includes a plurality of stopbands of which at least two stopbands are at different resonant frequencies, such that a change in the variable reactance causes changes in frequencies of the at least two stopbands.

8. The filter circuit of claim 7 wherein the variable reactance is variable between a first reactance value to provide harmonic notch filtering for a first base frequency and a second reactance value to provide harmonic notch filtering for a second base frequency, and the frequencies of the at least two stopbands when the variable reactance has the first reactance value are integer multiples of the first base frequency and the frequencies of the at least two stopbands when the variable has the second reactance value are the same integer multiples of the second base frequency.

9. The filter circuit of claim 8 wherein:
a first stopband of the at least two stopbands has a frequency that is twice the first base frequency when the variable reactance has the first reactance value and has a frequency that is twice the second base frequency when the variable reactance has the second reactance value, and
a second stopband of the at least two stopbands has a frequency that is three times the first base frequency when the variable reactance has the first reactance value and has a frequency that is three times the second base frequency when the variable reactance has the second reactance value.

10. The filter circuit of claim 7 wherein a ratio between the frequencies of the at least two stopbands increases when the variable reactance is changed.

11. The filter circuit of claim 7 wherein a ratio between the frequencies of the at least two stopbands decreases when the variable reactance is changed.

12. The filter circuit of claim 7 wherein a ratio between the frequencies of the at least two stopbands is unchanged when the variable reactance is changed.

13. The filter circuit of claim 1 wherein the filter circuit is configured to filter radio frequency signals.

14. The filter circuit of claim 1 further comprising a fourth impedance, the fourth impedance being an impedance of the first type, the fourth impedance being coupled to the second node, to the variable reactance, and to the second impedance.

15. The filter circuit of claim 1 further comprising a third node and a fourth impedance, the fourth impedance being an impedance of the first type, the third node coupled to a first end of the fourth impedance, and a second end of the fourth impedance being coupled to the first impedance, the second impedance, and the third impedance.

16. The filter circuit of claim 15 further comprising a fifth impedance, the fifth impedance being an impedance of the first type, the fifth impedance being coupled between the first node and the fourth impedance.

17. The filter circuit of claim 16 further comprising a sixth impedance, the sixth impedance being an impedance of the second type, the sixth impedance being coupled between the second end of the fourth impedance and the first impedance, the second impedance, and the third impedance.

18. The filter circuit of claim 17 further comprising a seventh impedance, the seventh impedance being an impedance of the first type, the seventh impedance being coupled between the second node and the variable reactance.

19. A method of filtering radio frequency signals, the method comprising:

filtering a first signal with a filter circuit, the filter circuit having a first frequency response that includes a plurality of stopbands;
adjusting a reactance of a variable reactance of the filter circuit to change two or more notch frequencies of a frequency response of the filter circuit responsive to filtering the first signal; and
filtering a second signal responsive to adjusting the reactance of the variable reactance.

20. The method of claim 19 wherein adjusting the reactance of the variable reactance includes manipulating a state of one or more switching devices coupled to the variable reactance, each switching device configured to selectively couple and decouple from the filter circuit a respective impedance element of the variable reactance.

21. The method of claim 19 wherein adjusting the reactance of the variable reactance to change at least two notch frequencies includes altering at least two stopbands of the filter circuit.

22. A front-end module comprising:
a filter circuit including
a first node;
a second node;
a variable reactance coupled to the first node, the variable reactance including at least one impedance of a first type;
a first impedance coupled to the first node, the first impedance being of a second type of impedance different than the first type;
a second impedance of the second type coupled between the variable reactance and the first impedance; and
a third impedance of the second type coupled at a first end to the first impedance and the second impedance, and coupled at a second end to the second node, the variable reactance being configured to operate in a plurality of resonant modes that each correspond to a resonant frequency between the variable reactance and reactances of one or more elements of a set including the first impedance, the second impedance, and the third impedance.

23. The front-end module of claim 22 further comprising:
a power source;
an antenna; and
a transceiver coupled to the power source and to the antenna.

24. The front-end module of claim 23 wherein the filter circuit is coupled between the transceiver and the antenna.

25. The front-end module of claim 22 further comprising a controller, the controller being configured to control a reactance of the variable reactance.

26. The front-end module of claim 25 wherein the variable reactance includes one or more switching devices configured to selectively couple and decouple the at least one impedance of the first type from the filter circuit, and wherein the controller is further configured to control the reactance of the variable reactance by providing one or more control signals to the one or more switching devices, the control signals controlling states of the one or more switching devices.

* * * * *